(12) United States Patent
Morita

(10) Patent No.: US 10,195,944 B2
(45) Date of Patent: Feb. 5, 2019

(54) CONTROL APPARATUS FOR POWER SUPPLY SYSTEM

(71) Applicant: DENSO CORPORATION, Kariya, Aichi-pref. (JP)

(72) Inventor: Yoshinori Morita, Kariya (JP)

(73) Assignee: DENSO CORPORATION, Kariya (JP)

( * ) Notice: Subject to any disclaimer, the term of this patent is extended or adjusted under 35 U.S.C. 154(b) by 28 days.

(21) Appl. No.: 15/608,289

(22) Filed: May 30, 2017

(65) Prior Publication Data
US 2017/0341517 A1 Nov. 30, 2017

(30) Foreign Application Priority Data
May 31, 2016 (JP) .................. 2016-109359

(51) Int. Cl.
| B60L 3/00 | (2006.01) |
| G01R 31/36 | (2006.01) |
| B60L 1/00 | (2006.01) |
| B60L 11/12 | (2006.01) |
| B60L 11/14 | (2006.01) |
| B60L 11/18 | (2006.01) |

(52) U.S. Cl.
CPC .............. B60L 3/0046 (2013.01); B60L 1/00 (2013.01); B60L 11/12 (2013.01); B60L 11/14 (2013.01); B60L 11/1862 (2013.01); B60L 11/1868 (2013.01); G01R 31/3658 (2013.01); B60L 2240/547 (2013.01)

(58) Field of Classification Search
CPC ............ B60L 3/0046; B60L 2240/547; G01R 31/3658

USPC ......................................................... 320/132
See application file for complete search history.

(56) References Cited

U.S. PATENT DOCUMENTS

| 6,209,494 B1 * | 4/2001 | Manikowski, Jr. et al. ................. B01J 6/008 123/3 |
| 6,346,340 B1 * | 2/2002 | Abersfelder et al. ..... H02J 1/00 180/53.8 |
| 6,672,415 B1 * | 1/2004 | Tabata ................... B60K 6/365 180/65.25 |
| 7,028,795 B2 * | 4/2006 | Tabata ................... B60K 6/365 180/65.21 |
| 7,273,120 B2 * | 9/2007 | Tabata ................... B60K 6/365 180/65.265 |
| 8,994,324 B2 * | 3/2015 | Nishina et al. ......... H02J 7/042 320/107 |

(Continued)

FOREIGN PATENT DOCUMENTS

JP 2012-090404 A 5/2012

Primary Examiner — Sun Lin
(74) Attorney, Agent, or Firm — Oliff PLC

(57) ABSTRACT

In a control apparatus mounted in a vehicle and configured to control a power supply system, a power generation controller is configured to operate an alternator such that a charge level of a second rechargeable battery becomes a target charge level. A target charge level setter is configured to variably set the target charge level of the second rechargeable battery based on changes in a state quantity correlated with at least one of a charge state and a discharge state of the second rechargeable battery. A limiter is configured to, if there is a change in the state quantity and if a prescribed permission condition is not met, limit an operation of the alternator.

12 Claims, 14 Drawing Sheets

(56) References Cited

U.S. PATENT DOCUMENTS

2017/0342953 A1* 11/2017 Morita ................ H02J 7/1461

* cited by examiner

CONTROL APPARATUS FOR POWER SUPPLY SYSTEM

CROSS-REFERENCE TO RELATED APPLICATION

This application is based on and claims the benefit of priority from earlier Japanese Patent Application No. 2016-109359 filed May 31, 2016, the description of which is incorporated herein by reference.

BACKGROUND

Technical Field

The present invention relates to a control apparatus for a power supply system including a first rechargeable battery, such as a lead-acid battery, and a second rechargeable battery, such as a lithium-ion battery, having a higher output density or energy density than the first rechargeable battery.

Related Art

A lead-acid battery (as a first rechargeable battery) is commonly mounted in a vehicle driven by an internal-combustion engine to supply electrical power to various electrical loads, such as a starter motor. The first rechargeable battery is cheaper than a second rechargeable battery that is a high power and high energy density battery, such as a nickel battery or a lithium-ion battery, but less durable for frequent charging and discharging. In particular, as a concern, vehicles provided with a stop and start function suffer from premature degradation of the first rechargeable battery caused by frequent discharging of the first rechargeable battery. As another concern, vehicles having an alternator used to generate charging power from vehicle's regenerative energy also suffer from premature degradation of the first rechargeable battery caused by frequent charging of the first rechargeable battery.

The second rechargeable battery is more expensive than the first rechargeable battery. Therefore, simply replacing the first rechargeable battery with the second rechargeable battery will lead to a significant increase in cost.

Conventionally, a technique has been proposed such that the second rechargeable, battery that is durable against frequent charging and discharging and the first rechargeable battery that is inexpensive are electrically connected in parallel to be mounted in the vehicles. In such a technique, when idling is stopped, the second rechargeable battery is preferentially used to supply power to electrical loads and preferentially charged, thereby mitigating degradation of the first rechargeable battery. In addition, when the vehicle is parked, the first rechargeable battery is preferentially used for power supply required over a long time period, whereby the increase in cost is prevented by reducing the capacity of the second rechargeable battery.

Upper and lower limits are defined for a state of charge (SOC) of the second rechargeable battery. The SOC is a ratio of an actual amount of charge to an amount of charge when fully charged. If the SOC is above the upper limit or if the SOC is below the lower limit, premature degradation may occur. To prevent such premature degradation, if the lower limit is reached when idling is stopped, the internal-combustion engine has to be started to charge the second rechargeable battery by using the alternator, which will lead to deterioration in fuel efficiency. If a target SOC that is a target value of SOC of the second rechargeable battery is set to the upper-limit to prevent the SOC from reaching the lower limit when idling is stopped, chances for power regeneration may be lost if the SOC has reached the upper limit when the regenerative power generation becomes available.

A control apparatus disclosed in Japanese Patent Application Laid-Open Publication No. 2012-90404 can solve such a problem. This control apparatus is configured to; based on power consumed when idling of an internal-combustion engine is stopped, modify a target SOC so that the SOC does not decrease below the target SOC. With such a configuration, the opportunity for charging with regenerative power can be ensured.

Regarding processing to modify the target SOC, as in the control apparatus disclosed in Japanese Patent Application Laid-Open Publication No. 2012-90404, the SOC may be less than the modified target SOC at the modification of the target SOC. In such an event, the alternator will be operated to increase the SOC to the modified target SOC. Thus, the internal-combustion engine will be loaded, which may reduce the rotational speed of the internal-combustion engine. This may cause the driver of the vehicle to sense an unexpected braking force, which may result in deterioration of drivability.

In consideration of the foregoing, exemplary embodiments of the present invention are directed to providing a control apparatus capable of preventing deterioration of drivability.

SUMMARY

In accordance with an exemplary embodiment of the present invention, there is provided a control apparatus mounted in a vehicle and configured to control a power supply system including: an alternator connected to an output shaft of an internal-combustion engine of the vehicle and configured to perform power generation by rotation of the output shaft of the internal-combustion engine; a first rechargeable battery that can be charged with electrical power generated by the alternator; a second rechargeable battery electrically connected in parallel with the first rechargeable battery, the second rechargeable battery having a higher output density or a higher energy density than the first rechargeable battery. The control apparatus includes: a power generation controller configured to operate the alternator such that a charge level of the second rechargeable battery becomes a target charge level; a target charge level setter configured to variably set the target charge level of the second rechargeable battery based on changes in state quantity correlated with at least one of a charge state and a discharge state of the second rechargeable battery; and a limiter configured to, if there is a change in the state quantity and if a prescribed permission condition is not met, limit the operation of the alternator.

When the second rechargeable battery has to be charged in response to the modification of the target SOC, the operation of the alternator will be started. As the alternator is coupled to the output shaft of the internal-combustion engine, the internal-combustion engine will be loaded by the operation of the alternator, which may reduce the rotational speed of the internal-combustion engine. The rotational speed reduction may cause the driver of the vehicle to feel an unexpected braking force, which may result in deterioration of drivability. With the above configuration, if the prescribed permission condition is not met, the operation of the alternator in response to the modification of the target SOC is limited. Therefore, the operation of the alternator can be limited in a situation where the drivability is likely to be deteriorated by initiation of the operation of the alternator. Hence, the deterioration of drivability can be prevented.

DESCRIPTION OF SPECIFIC EMBODIMENTS

Figure 1A:
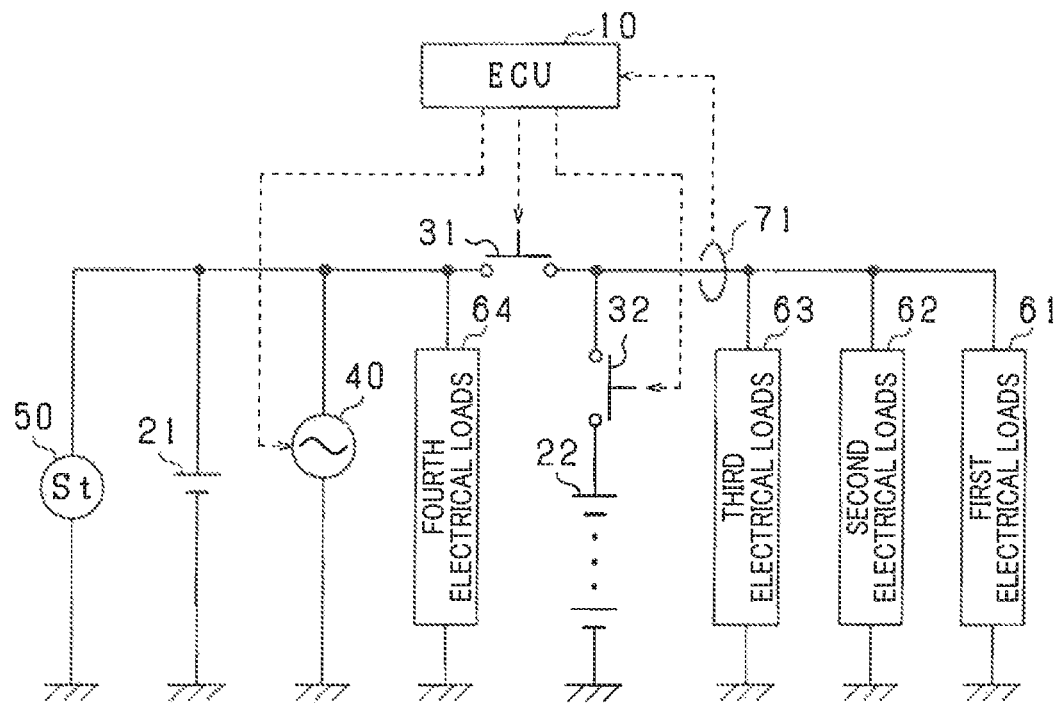
FIG. 1A is a block diagram of a power supply system including a control apparatus in accordance with a first embodiment.

Example embodiments will now be described more fully with reference to the accompanying drawings. Example embodiments are provided so that this disclosure will be thorough, and will fully convey the scope to those who are skilled in the art. Numerous specific details are set forth such as examples of specific components to provide a thorough understanding of embodiments of the present disclosure. It will be apparent to those skilled in the art that example embodiments may be embodied in many different forms and that neither should be construed to limit the scope of the disclosure. Identical or equivalent components or components of equal or equivalent function are thereby identified by the same or similar reference numerals.

First Embodiment

A power supply system of the present embodiment may be mounted in a vehicle equipped with an internal-combustion engine as a driving power source. The vehicle has a stop and start function such that if a prescribed automatic stop condition is met, the internal-combustion engine will be automatically stopped, and if a prescribed restart condition is met, then the internal-combustion engine will be restarted. In addition, the vehicle also has a regenerative charging function to generate electrical charging power from regenerative energy.

As shown in FIG. 1, rechargeable batteries including a first rechargeable battery 21 and a second rechargeable battery 22 are mounted in the vehicle carrying the power supply system. The first rechargeable battery 21 is a well-known lead-acid battery. More specifically, the lead-acid battery is formed of a series connection of a plurality of battery cells. Each cell includes lead dioxide (PbO2) as a positive-electrode active material, lead (Pb) as a negative-electrode active material, and sulfuric acid (H2SO4) as an electrolyte.

The second rechargeable battery 22 is a well-known lithium-ion battery. More specifically, an oxide of lithium-containing oxide, such as LiCoO2, LiMn2O4, LiNiO2, LiFePO4, is used as a positive-electrode active material of the seconds rechargeable battery 22. Carbon, graphite, lithium titanate (e.g., LixTiO2), a Si- or Su-containing alloy is used as a negative-electrode active material of the second rechargeable battery 22. Organic electrolyte solution is used as an electrolyte solution of the second rechargeable battery 22. The second rechargeable battery 22 is formed of a series connection of a plurality of battery cells, each of which has these electrodes. With such a configuration, the second rechargeable battery 22 has a larger energy density output density than the first rechargeable battery 21.

The first rechargeable battery 21 and the second rechargeable battery 22 are electrically connected in parallel with each other through a first switch 31 therebetween. When the first switch 31 is on, the first rechargeable battery 21 side and the second rechargeable battery 22 side are electrically connected to each other. When the first switch 31 is off, the first rechargeable battery 21 side and the second rechargeable battery 22 side are electrically disconnected from each other. The first switch 31 may be a metal-oxide semiconductor field-effect transistor (MOS-FET).

The second rechargeable battery 22 is electrically connected to the second rechargeable battery 22 side of the first switch 31 through the second switch 32. Therefore, the first rechargeable battery 21 side and the second rechargeable battery 22 side are electrically connected to each other by turning on the first switch 31 and the second switch 32. By turning on the first switch 31 and turning off the second switch 32, the first rechargeable battery 21 side and the second rechargeable battery 22 side are electrically connected to each other and the second rechargeable battery 22 is disconnected from the second rechargeable battery 22 side of the first switch 31. The second switch 32 may be a relay.

On the first rechargeable battery 21 side of the first switch 31, an alternator 40 and a starter motor 50 are electrically connected in parallel with the first rechargeable battery 21. The alternator 40 may be a well-known alternator including a rotor coil wound around a rotor, a stator coil wound around a stator, a regulator, and a rectifier, to generate electrical power from rotation energy of an output shaft of the internal-combustion engine. More specifically, rotation of the rotor of the alternator 40 induces alternating current in the stator as a function of excitation current flow through the rotor coil. The alternating current is converted into a direct-current (DC) by the commutator. A DC voltage is adjusted to be a target voltage by adjusting the excitation current flow through the rotor coil. The starter motor 50, which is used to start the internal-combustion engine, applies an initial torque to a rotary shaft of the internal-combustion engine when energized. The alternator 40 generates electrical power in response to an instruction from an electrical control unit (ECU) 10, where ECU 10 has a function of a power generation controller (described later with reference to FIG. 1B).

On the second rechargeable battery 22 side, first to third electrical loads 61-63 are electrically connected to a connection point between the first switch 31 and the second switch 32 in parallel with the second rechargeable battery 22.

The first electrical loads 61 are electrical loads that do not operate when the internal-combustion engine is stopped. More specifically, the first electrical loads 61 include a fuel pump and an injector for supplying fuel to a combustion chamber of the internal-combustion engine, an igniter for igniting the fuel, a throttle valve for controlling an intake volume of the combustion chamber.

The second electrical loads 62 are electrical loads that operate when the internal-combustion engine is stopped. More specifically, the second electrical loads 62 include an electrically operated oil pump that circulates oil when the internal-combustion engine is stopped in a vehicle's stationary state, a hill hold control that activates a brake's solenoid valve when the vehicle is not moving (stationary), and a brake lamp that is lit when the vehicle is decelerated or stationary. The internal-combustion engine is also provided with a mechanical oil pump that circulates oil during operation of the internal-combustion engine.

The third electrical loads 63 are electrical loads, the voltage of supply power to which is required to be substantially constant or at least stable so that it varies within a predetermined range. The third electrical loads 63 include a navigation unit and an audio device. In the event that the voltage of supply power is not constant, but significantly varies or varies over the predetermined range, the voltage of supply power is likely to momentarily drop below a minimum operating voltage. If the voltage of supply power drops below the minimum operating voltage, a malfunction may occur such that the operation of the navigation unit or the like will be reset. The supply power to the third electrical loads 63 is required not to drop below the minimum operating voltage and to be stable at a constant value.

On the first rechargeable battery 21 side, the fourth electrical loads 64 are electrically connected in parallel with the first rechargeable battery 21. The fourth electrical loads 64 include headlights and a windshield wiper.

The power supply system configured as above is controlled by the ECU 10 serving as a control apparatus for the power supply system. More specifically, the ECU 10 controls the open/closed state of each of the first switch 31 and the second switch 32 and a power generation amount of the alternator 40, depending on an operating condition of the internal-combustion engine, a state of charge (SOC) of the second rechargeable battery 22 indicative of a charge level of the second rechargeable battery 22, and a target SOC of the second rechargeable battery 22 that is a target value of the SOC of the second rechargeable battery 22. The SOC is a ratio of an actual charge level to a charge level when fully charged. The target SOC may also be referred to as a target charge level. Utilizing a fact that the SOC of the second rechargeable battery 22 increases with increasing terminal voltage of the second rechargeable battery 22, the SOC of the second rechargeable battery 22 can be acquired by measuring the terminal voltage of the second rechargeable battery 22. A relationship between the SOC and the terminal voltage of the second rechargeable battery 22 is stored in a memory (e.g., ROM, RAM or the like described later) of the ECU 10.

How to control the open/closed state of each of the first switch 31 and the second switch 32 depending on the operating condition of the internal-combustion engine, the SOC of the second rechargeable battery 22, and the target SOC of the second rechargeable battery 22 will now be described with reference to FIGS. 2-5. The ECU 10 has a function of a connection controller (described below with reference to FIG. 1B) to change the open/closed state of each of the first switch 31 and the second switch 32.

Figure 2:
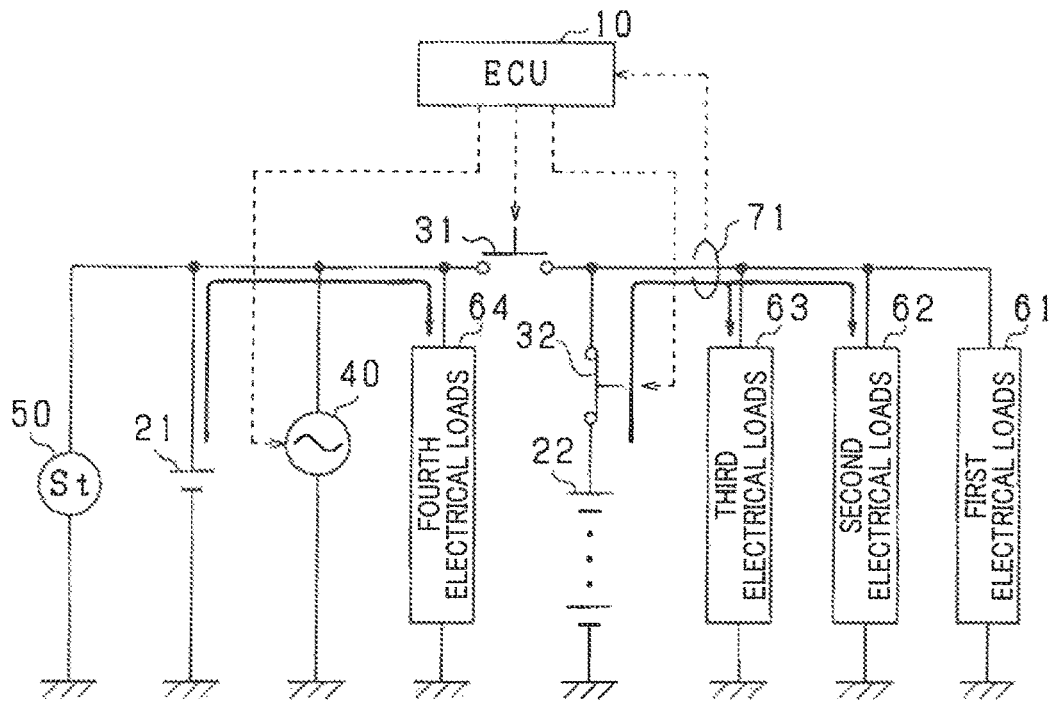
FIG. 2 is an example of electrical paths when idling of an internal-combustion engine is stopped.

When idling of the internal-combustion engine is stopped, as shown in FIG. 2, the first switch 31 is tuned off and the second switch 32 is turned on, whereby the fourth electrical loads 64 are supplied with power from the first rechargeable battery 21 and the second electrical loads 62 and the third electrical loads 63 are supplied with power from the second rechargeable battery 22. As described above, the first electrical loads 61 are deactivated when idling of the internal-combustion engine is stopped. Thus, the first electrical loads 61 are not supplied with power. When idling of the internal-combustion engine is stopped, the starter motor 50 will be supplied with power if a prescribed restart condition is met, whereby the internal-combustion engine will be restarted. In this case, as the first switch 31 is off, the starter motor 50 will be supplied with power from the first rechargeable battery 21.

Figure 3:
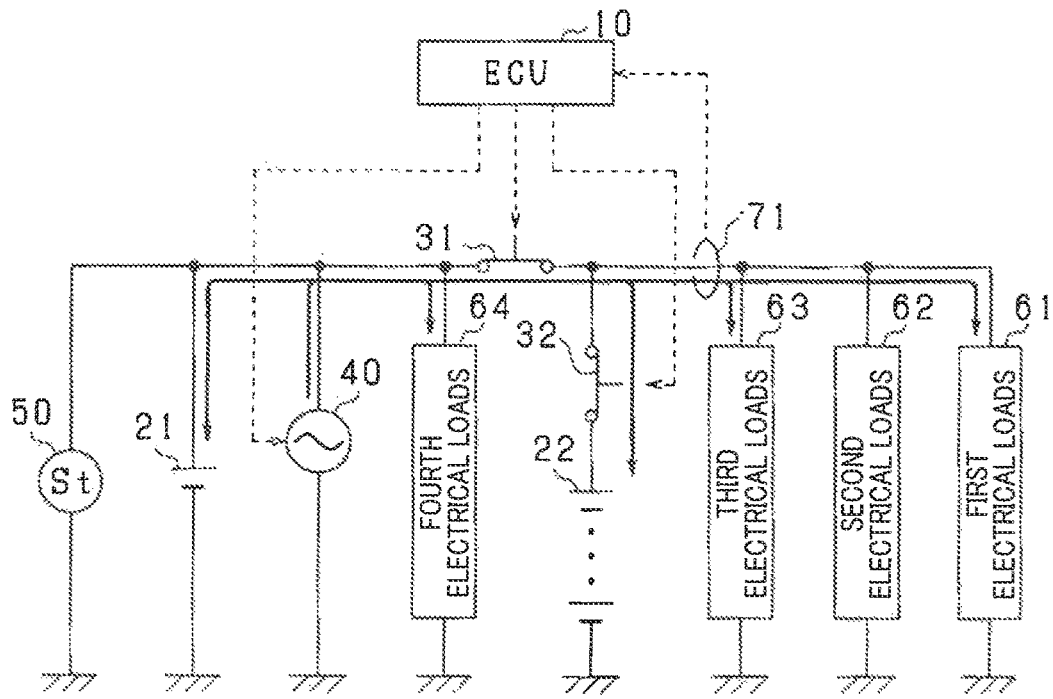
FIG. 3 is an example of electrical paths when power generation is being performed by an alternator.

If the SOC of the second rechargeable battery 22 is less than the target SOC, the first switch 31 and the second switch 32 are both turned on as shown in FIG. 3. In this case, the ECU 10 transmits an activation command to the alternator 40 to perform power generation by the alternator 40. The power generated by the alternator 40 is supplied to the second rechargeable battery 22 via the first switch 31 and the second switch 32. In addition, the power generated by the alternator 40 is supplied to the first electrical loads 61 and the third electrical loads 63. As the second electrical loads 62 are deactivated when the internal-combustion engine is operating as described above, the second electrical loads 62 are not supplied with power. Also, when power is regenerated during deceleration, the first switch 31 and the second switch 32 are both turned on as shown in FIG. 3, whereby power generated by the alternator 40 is supplied to the second rechargeable battery 22.

Figure 4:
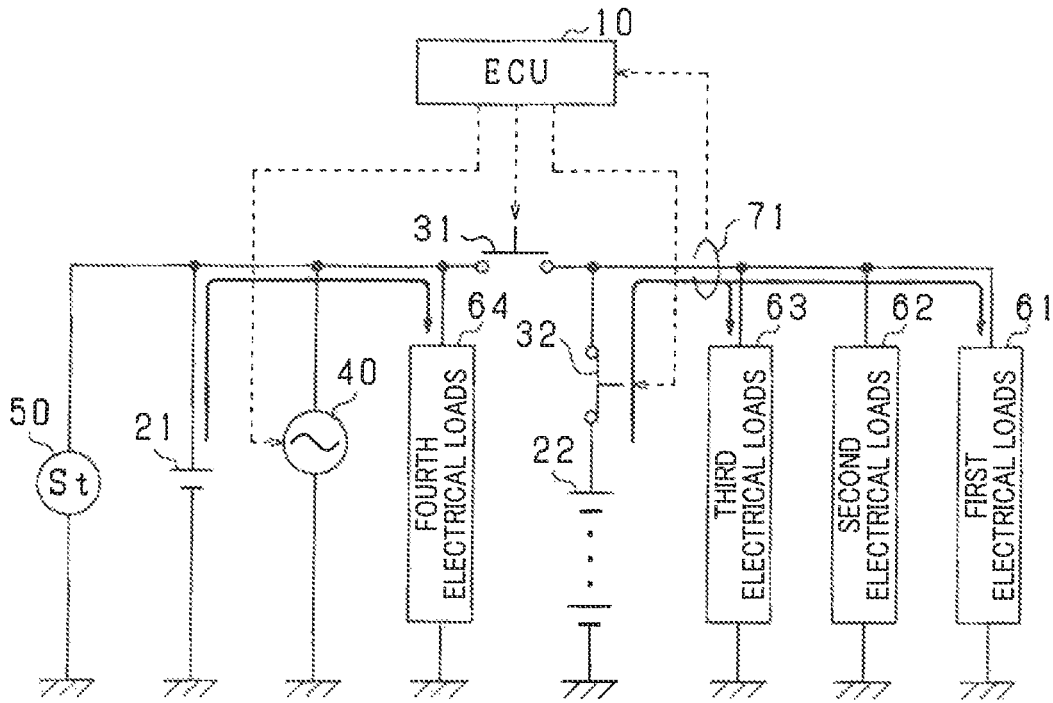
FIG. 4 is an example of electrical paths when an SOC is greater than a target SOC.

If the SOC of the second rechargeable battery 22 is greater than the target SOC, the first switch 31 is turned off and the second switch 32 is turned on as shown in FIG. 4. In this case, the fourth electrical loads 64 are supplied with power from the first rechargeable battery 21, and the first electrical loads 61 and the third electrical loads 63 are supplied with power from the second rechargeable battery 22. As the second electrical loads 62 are deactivated when the internal-combustion engine is operating, the second electrical loads 62 are not supplied with power.

Figure 5:
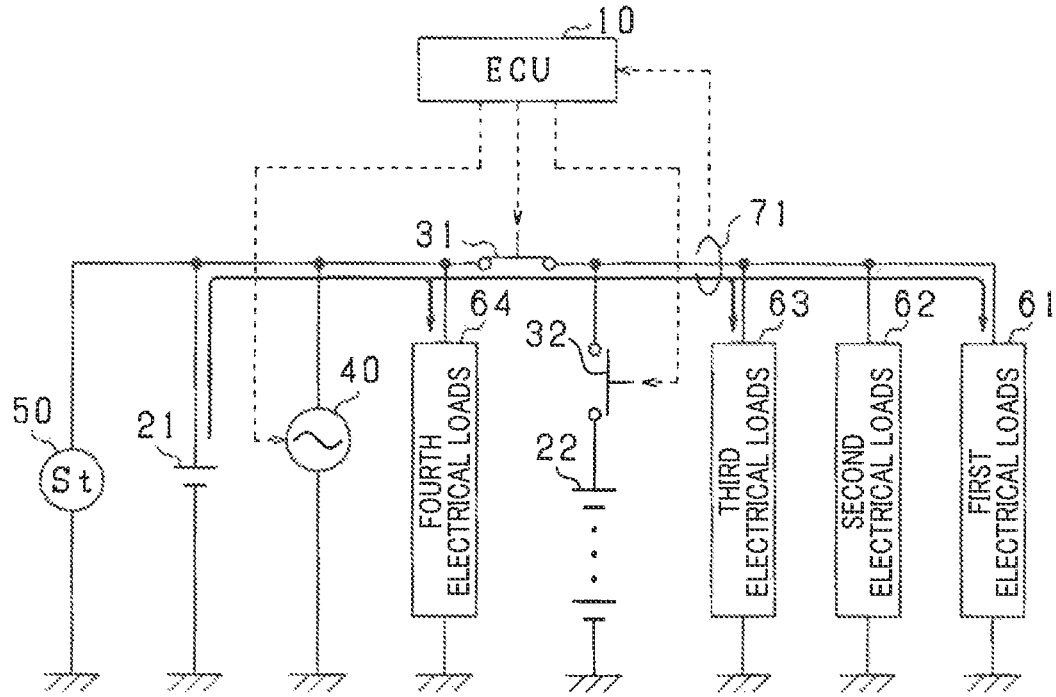
FIG. 5 is an example of electrical paths when the SOC is kept at the target SOC.

If the SOC of the second rechargeable battery 22 is substantially equal to the target SOC and if the internal-combustion engine is operating, the first switch 31 is turned on and the second switch 32 is turned off as shown in FIG. 5. In this case, the first electrical loads 61, the third electrical loads 63, and the fourth electrical loads 64 are supplied with power from the first rechargeable battery 21. As the second electrical loads 62 are deactivated when the internal-combustion engine is operating, the second electrical loads 62 are not supplied with power. In addition, the first electrical loads 61, the third electrical loads 63, and the fourth electrical loads 64 are not supplied with power from the second rechargeable battery 22. Therefore, the SOC of the second rechargeable battery 22 will be kept at the target SOC. That is, even if the internal-combustion engine transitions from an operating state as shown in FIG. 5 into a state where idling is stopped, the SOC of the second rechargeable battery 22 remains at the target SOC. Therefore, the second rechargeable battery 22 is at a sufficient charge level.

In the present embodiment, prior to controlling the first switch 31 and the second switch 32 using the SOC and the target SOC of the second rechargeable battery 22, processing to alter the target SOC of the second rechargeable battery 22 is performed. More specifically, when idling of the internal-combustion engine is stopped, the target SOC of the second rechargeable battery 22 is modified so that the SOC of the second rechargeable battery 22 does not drop below the lower limit of the SOC. The ECU 10 has a function of a target SOC (charge level) setter (described later with reference to FIG. 1B) in this processing.

Figure 6:
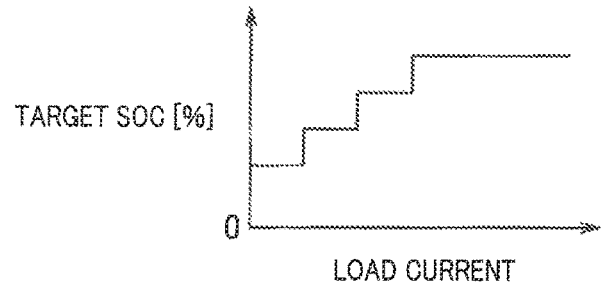
FIG. 6 is a graph of target SOC versus load current value.

The target SOC is determined based on a load current supplied to the first to third electrical loads 61-63 such that, as shown in FIG. 6, the target SOC is increased with increasing load current. As above, the first electrical loads 61 do not operate when idling of the internal-combustion engine is stopped, that is, when the internal-combustion engine is stopped. The second electrical loads 62 do not operate when the internal-combustion engine is operating and operate when the internal-combustion engine is stopped. Hence, to detect the load current when the internal-combustion engine is operating and determine the target SOC based on the detected load current, the load current will be detected in situations where the first electrical loads 61 are operating and the second electrical loads 62 are not operating. An amount of discharge of the second rechargeable battery 22 increases with increasing load current. Therefore, the load current is a state quantity correlated with a discharging state of the second rechargeable battery 22.

When a load current is detected during operation of the internal-combustion engine, a first load quantity, which is indicative of a current supplied to the first electrical loads 61, is subtracted from the detected load current. In addition, a second load quantity, which is indicative of a current supplied to the second electrical loads 62, is added to the detected current. The first load quantity is determined based on consumption currents in prescribed operating states of the respective first electrical loads 61. The second load quantity is determined based on consumption currents in prescribed operating states of the respective second electrical loads 62. The first and second load quantities are stored in the memory of the ECU 10.

Processing to be performed in the ECU 10 configured as above will now be described with reference to a flowchart of FIG. 7. This control processing is performed every predetermined control cycle.

Fist, in step S100, the ECU 10 determines whether or not the internal-combustion engine is operating. If it is determined that the internal-combustion engine is not operating, then the process flow ends. If it is determined that the internal-combustion engine is operating, then the process flow proceeds to step S101. In step S101, the ECU 10 acquires a value of load current from the current detector 71. Subsequently, in step S102, the ECU 10 subtracts a first load quantity from the load current value, and then in step S103, adds a second load quantity to the load current value minus the first load quantity. In step S104, the ECU 10 determines a target SOC using the resultant value of load current, that is, the load current value minus the first load quantity plus the second quantity.

After the target SOC is determined, the process flow proceeds to step S105. In step S105, the ECU 10 determines whether or not the target SOC has changed from the previous target SOC that is a target SOC used in the previous cycle. If in step S105 it is determined the target SOC has changed from the previous target SOC, then in step S106, the ECU 10 determines whether or not a condition for modifying the target SOC (hereinafter referred to as a modification condition) is met. In step S106, it is determined whether or not power generation is being performed by the alternator 40. That is, the modification condition is that power generation is being performed by the alternator 40 and power generation by the alternator 40 is not to be started in response to modification of the target SOC. If the ECU 10 determines not to modify the target SOC, power generation will not be performed by the alternator 40 in response to modification of the target SOC. Therefore, in step S106, the ECU 10 has a function of a limiter that restricts the operation of the alternator 40.

If in step S106 it is determined that the modification condition is met, that is, if power generation is being performed by the alternator 40, then the process flow proceeds to step S107, where the ECU 10 modifies the target SOC. Thereafter, the process flow ends.

If in step S105 it is determined that the target SOC has not changed from the previous target SOC or if in step S106 the modification condition is not met, then the ECU 10 does not modify the target SOC. Thereafter, the process flow ends.

Figure 1B:
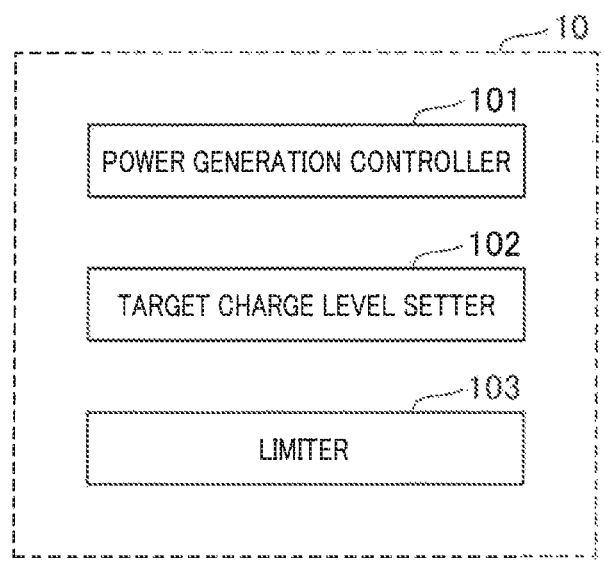
FIG. 1B is a functional block diagram of the control apparatus.

The ECU 10 may be a microcomputer formed of a central processing unit (CPU), a read-only memory (ROM), a random-access memory (RAM), and other components. As shown in FIG. 1B, the ECU 10 includes, as functional blocks to perform the above processing, a power generation controller 101, a target charge level setter 102, and a limiter 103. Functions of these blocks may be implemented by the CPU of the ECU 10 executing computer programs stored in the ROM. The power generation controller 101 is configured to operate the alternator such that a charge level of the second rechargeable battery 22 becomes a target charge level. The target charge level setter 102 is configured to variably set the target charge level of the second rechargeable battery 22 based on changes in state quantity correlated with at least one of a charge state and a discharge state of the second rechargeable battery 22. That is, the target charge level setter 102 performs steps S101-S104. The limiter 103 is configured to, if there is a change in the state quantity and if a prescribed permission condition is not met, limit the operation of the alternator 40. That is, the limiter 103 performs steps S105-S107.

Figure 8:
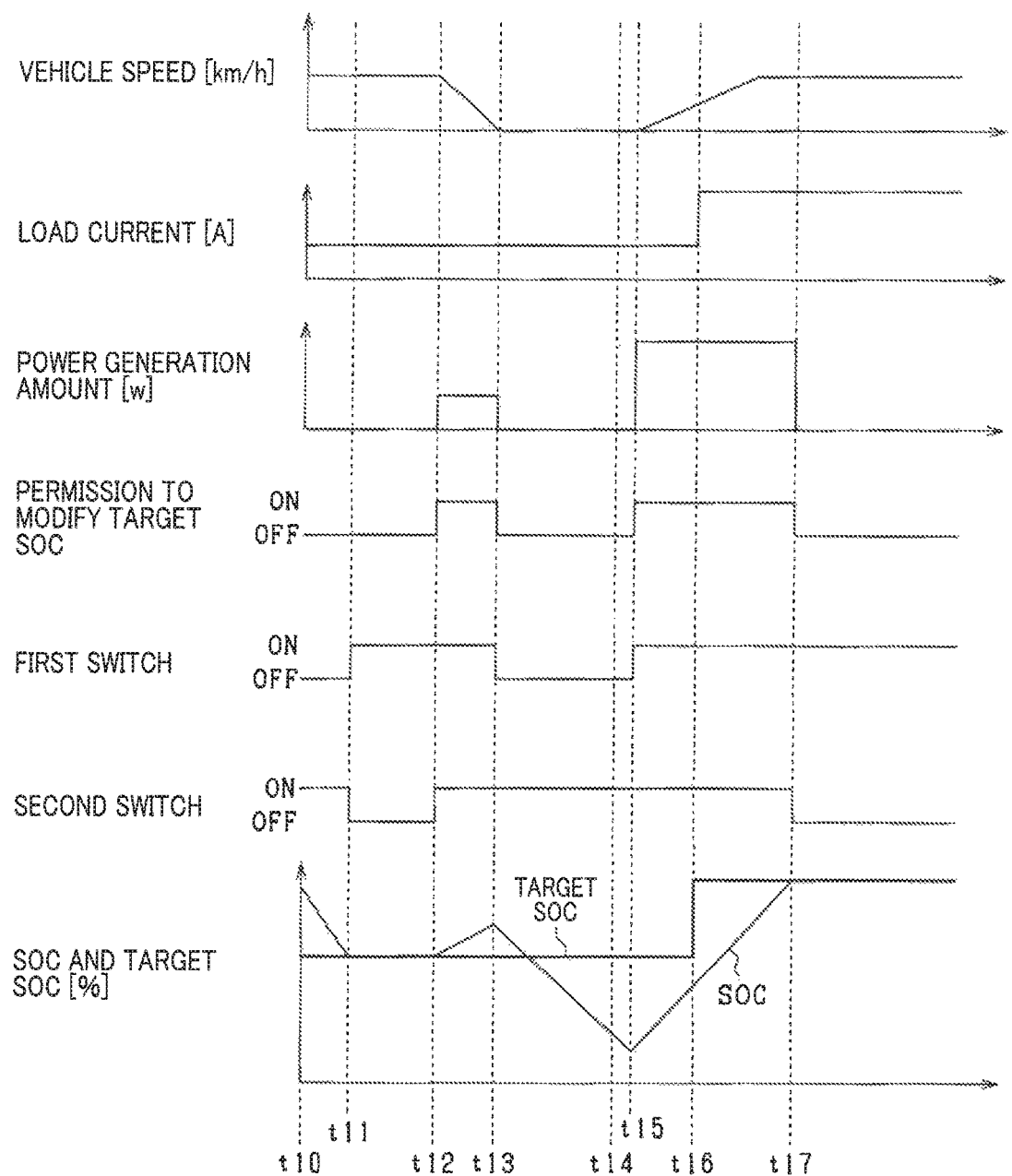
FIG. 8 is a timing diagram illustrating an example of processing of the first embodiment.

The above processing is performed repeatedly in successive cycles. An example of resultant time variations in the SOC and the target SOC will be described with reference to a timing diagram of FIG. 8.

At time t10, the first switch 31 is turned off and the second switch 32 is turned on because the SOC is greater than the target SOC, whereby the first to third electrical loads 61-63 are supplied with power from the second rechargeable battery 22. Then, the SOC of the second rechargeable battery 22 decreases.

When the SOC reaches the target SOC at time t11, the first switch 31 is turned on and the second switch 32 is turned off to keep the SOC at the target SOC. Then, the first to third electrical loads 61-63 are supplied with power from the first rechargeable battery 21.

When the vehicle starts deceleration at time t12, power regeneration is performed by the alternator 40. The first switch 31 and the second switch 32 are both turned on to collect the regenerative power in the second rechargeable battery 22. As the power generation is being performed by the alternator 40, the target SOC is permitted to be modified.

When the vehicle speed reaches substantially zero at time t13, the start-stop control is performed and the operation of the internal-combustion engine is thereby stopped. The first switch 31 is turned off and the second switch 32 is turned on to supply power from the second rechargeable battery 22 to the first to third electrical loads 61-63. Thus, the SOC of the second rechargeable battery 22 decreases due to power supply to the first to third electrical loads 61-63.

When a restart condition for restarting the internal-combustion engine is met at time t14, the starter motor 50 is activated. As the first switch 31 is off, the starter motor 50 is supplied with power from the first rechargeable battery 21 and the second rechargeable battery 22 continues to supply power to the first to third electrical loads 61-63.

When the internal-combustion engine is started at time t15, the first switch 31 and the second switch 32 are both turned on to charge the second rechargeable battery 22 with power generated by the alternator 40. The power consumption by the first to third electrical loads 61-63 is covered by electrical power generated by the alternator 40. As power generation is being performed by the alternator 40, the target SOC is permitted to be modified.

When the load current increases at time t16, the target SOC is modified as the target SOC is permitted to be modified. The increase in load current at time t16 may be caused by activation of some vehicle-mounted electrical devices. As the second rechargeable battery 22 continues to be charged at time t16, the first switch 31 and the second switch 32 are kept on.

When the SOC reaches the target SOC at time t17, power generation by the alternator 40 is terminated. The first switch 31 is turned on and the second switch 32 is turned off to keep the SOC at the target SOC. The first to third electrical loads 61-63 are supplied with power from the first rechargeable battery 21.

Figure 9:
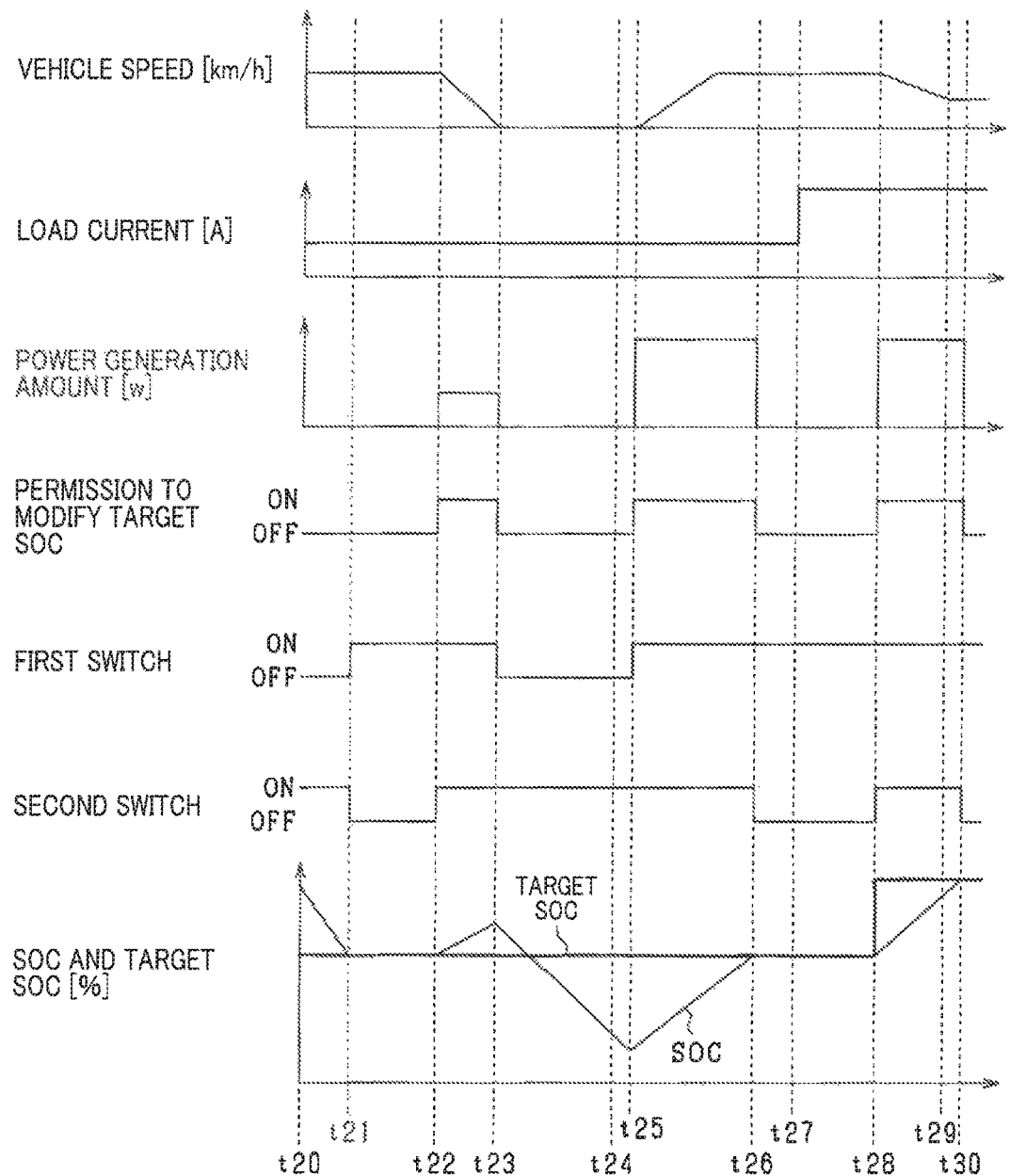
FIG. 9 is a timing diagram illustrating another example of processing of the first embodiment.

Subsequently, an example case where the target SOC is not modified despite an increase in the load current will be described with reference to a timing diagram of FIG. 9.

Control processing performed for a time period of time t20 through time t25 is similar to the control processing performed for a time period of time t10 to time t15. Therefore, descriptions of the control processing for the time period of time t20 through time t25 will not be repeated below.

When the SOC reaches the target SOC at time t26, power generation by the alternator 40 is stopped. Then, the first switch 31 is turned on and the second switch 32 is turned off to keep the SOC at the target SOC.

When the load current increases at time t27, the target SOC is required to be increased accordingly. As power generation by the alternator 40 is already stopped, the target SOC is not permitted to be modified. Therefore, the target SOC is not modified.

When the vehicle starts deceleration at time t28, power regeneration is performed by the alternator 40. Then, the first switch 31 and the second switch 32 are both turned on to collect the regenerative power in the second rechargeable battery 22. As the power generation is being performed by the alternator 40, the target SOC is permitted to be modified.

Although deceleration of the vehicle is terminated at time t29, the SOC has not yet reached the target SOC. Therefore, the alternator 40 continues to operate.

When the SOC reaches the target SOC at time t30, power generation by the alternator 40 is terminated. The first switch 31 is turned on and the second switch 32 is turned off to keep the SOC at the target SOC. Then, the first to third electrical loads 61-63 are supplied with power from the first rechargeable battery 21.

Figure 10:
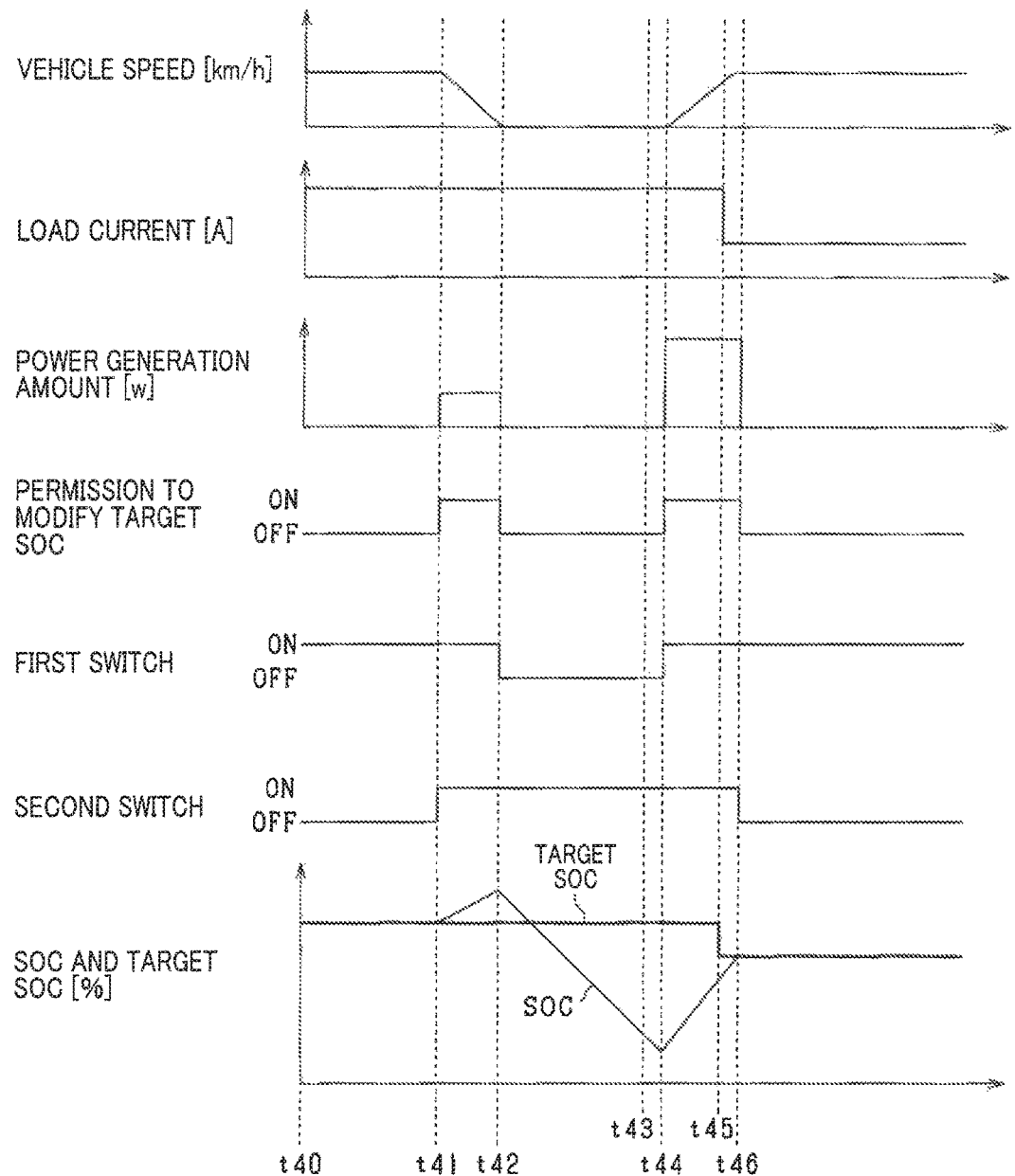
FIG. 10 is a timing diagram illustrating another example of processing of the first embodiment.

Subsequently, an example case where the target SOC is decreased will now be described with reference to a timing diagram of FIG. 10.

The SOC is substantially equal to the target SOC at time t40. Then, the first switch 31 is turned on and the second switch 32 is turned off to keep the SOC at the target SOC.

When the vehicle starts deceleration at time t41, power regeneration is performed by the alternator 40. At this time, the first switch 31 and the second switch 32 are both turned on to collect the regenerative power in the second rechargeable battery 22. As the power generation is being performed by the alternator 40, the target SOC is permitted to be modified.

When the vehicle speed reaches substantially zero at time 42, the start-stop control is performed and the operation of the internal-combustion engine is thereby stopped. The first switch 31 is turned off and the second switch 32 is turned on to supply power from the second rechargeable battery 22 to the first to third electrical loads 61-63. Thus, the SOC of the second rechargeable battery 22 decreases due to power supply to the first to third electrical loads 61-63.

When the restart condition for restarting the internal-combustion engine is met at time t43, the starter motor 50 is activated. As the first switch 31 is off, the starter motor 50 is supplied with power from the first rechargeable battery 21 and the second rechargeable battery 22 continues to supply power to the first to third electrical loads 61-63.

When the internal-combustion engine is started at time t44, the first switch 31 and the second switch 32 are both turned on to charge the second rechargeable battery 22 with power generated by the alternator 40. The power consumption by the first to third electrical loads 61-63 is covered by electrical power generated by the alternator 40. As power generation is being performed by the alternator 40, the target SOC is permitted to be modified.

When the load current decreases at time t45, the target SOC is modified as the target SOC is permitted to be modified. The decrease in load current at time t45 may be caused by deactivation of some vehicle-mounted electrical devices. As the SOC has not yet reached the modified target SOC, the first switch 31 and the second switch 32 are both turned on to continue charging the second rechargeable battery 22.

When the SOC reaches the target SOC at time t46, power generation by the alternator 40 is terminated. The first switch 31 is turned on and the second switch 32 is turned off to keep the SOC at the target SOC. Then, the first to third electrical loads 61-63 are supplied with power from the first rechargeable battery 21.

The rechargeable battery control apparatus of the present embodiment can provides following advantages.

(A1) When the target SOC is modified, the SOC may become less than the target SOC, so that power generation by the alternator 40 may be started in response to modification of the target SOC to increase the SOC to the target SOC. In the present embodiment, the target SOC is not modified unless the modification condition is met, which can prevent power generation by the alternator 40 from being started in response to modification of the target SOC. Therefore, deterioration of drivability can be prevented that can occur at the start of power generation by the alternator 40.

(A2) When the SOC of the second rechargeable battery 22 is less than the modified target SOC, power generation by the alternator 40 will be started in response to modification of the target SOC to increase the SOC to the modified target SOC. If power generation by the alternator 40 is being performed when the target SOC is about to be modified, the power generation will be continued. That is, power generation by the alternator 40 may not be started in response to modification of the target SOC. In the present embodiment, the target SOC is permitted to be modified if the modification condition is met that power generation by the alternator 40 is being performed. This configuration can prevent deterioration of drivability that can occur when power generation by the alternator 40 is started.

(A3) When idling of the internal-combustion engine is stopped, the first electrical loads 61 consume no power because the first electrical loads 61 are not operating, but the second electrical loads 62 consume power to operate. Therefore, when the target SOC is set during operation of the internal-combustion engine, there may be a discrepancy between a load current when the internal-combustion engine is operating and a load current when idling of the internal-combustion engine is stopped. A large target SOC set for the load current may reduce the idle capacity of the second rechargeable battery 22, which may lead to loss of opportunities for charging with regenerative power. A small target SOC set for the load current may cause the SOC to decrease below the lower limit when idling is stopped, which may give rise to a need for restarting the internal-combustion engine. Thus, the fuel efficiency may be deteriorated. In the present embodiment, the target SOC is calculated based on a detected load current value by at least one of subtracting a first load quantity, which is indicative of a current supplied to the first electrical loads 61 that operate when the internal-combustion engine is operating, from the detected load current value and adding a second load quantity, which is indicative of a current supplied to the second electrical loads 62 that operate when the Internal-combustion engine is not operating, to the detected current value. With this configuration, the target SOC can be more appropriate for the load current when idling of the internal-combustion engine is stopped, which can prevent the SOC from decreasing below the lower limit of the SOC when idling of the internal-combustion engine is stopped.

Second Embodiment

A second embodiment is different from the first embodiment in the modification condition for permitting the target SOC to be modified. More specifically, if the SOC of the second rechargeable battery 22 is greater than a modified target SOC, the target SOC is permitted to be modified. Therefore, in the case where the SOC exceeds the target SOC due to power regeneration or in the case where the target SOC is increased after being decreased, the modification condition that the SOC of the second rechargeable battery 22 is greater than a modified target SOC is met.

Processing of the present embodiment will now be described with reference to FIG. 11. A flowchart of the processing of the present embodiment is similar to the flowchart of FIG. 7. Therefore, it will not be described again.

At time 50, the first switch 31 is turned off and the second switch 32 is turned on because the SOC is greater than the target SOC, whereby the first to third electrical loads 61-63 are supplied with power from the second rechargeable battery 22. Then, the SOC of the second rechargeable battery 22 decreases.

When the vehicle starts deceleration at time t51, power regeneration is performed by the alternator 40. At this time, the first switch 31 and the second switch 32 are both turned on to collect the regenerative power in the second rechargeable battery 22.

When the vehicle terminates deceleration at time t52, the first switch 31 is turned off and the second switch 32 is turned on because the SOC is greater than the target SOC, whereby the first to third electrical loads 61-63 are supplied with power from the second rechargeable battery 22. Then, the SOC of the second rechargeable battery 22 decreases.

When the vehicle restarts deceleration at time t53, power regeneration is performed by the alternator 40. At this time, the first switch 31 and the second switch 32 are both turned on to collect the regenerative power in the second rechargeable battery 22.

When the vehicle terminates deceleration at time t54, the first switch 31 is turned off and the second switch 32 is turned on because the SOC is greater than the target SOC, whereby the first to third electrical loads 61-63 are supplied with power from the second rechargeable battery 22. Then, the SOC of the second rechargeable battery 22 decreases.

When the load current increases at time t55, the target SOC is calculated based on the increased load current, comparison is made between the calculated target SOC (as a modified target SOC) and the SOC. In the example of FIG. 11, the SOC is greater than the modified target SOC. Therefore, the target SOC is permitted to be modified.

The target SOC is modified at time t56 because the target SOC is permitted to be modified. At this time, the SOC is greater than the modified target SOC. Therefore, although the target SOC is modified, power generation will not be performed by the alternator 40.

As the SOC is greater than the target SOC until time t57, the first switch 31 is turned off and the second switch 32 is turned on, whereby the first to third electrical loads 61-63 are supplied with power from the second rechargeable battery 22. When the SOC reaches the target SOC at time t57, the first switch 31 is turned on and the second switch 32 is turned off, thereby keeping the SOC at the target SOC.

Figure 11:
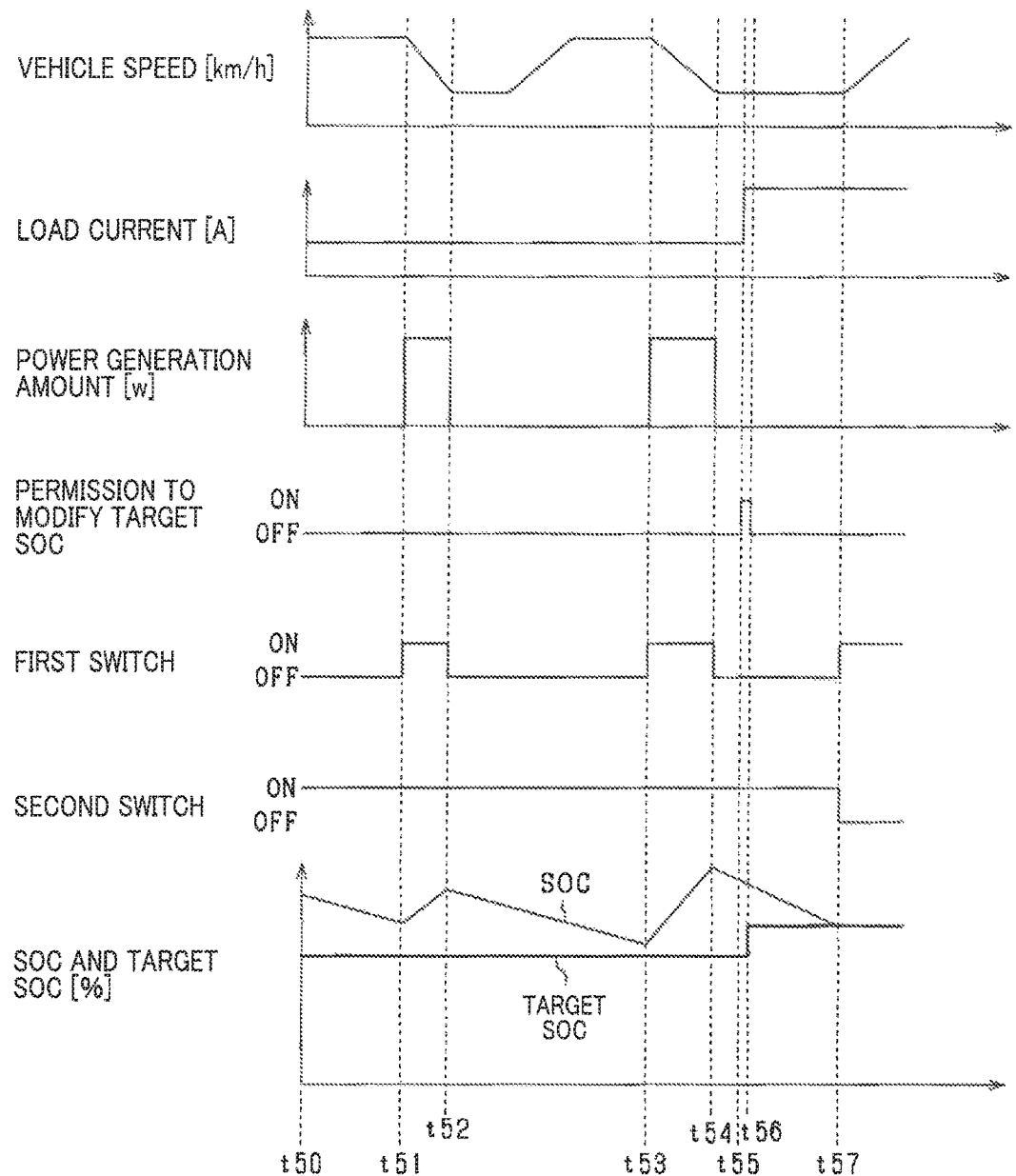
FIG. 11 is a timing diagram illustrating an example of processing in accordance with a second embodiment of the present invention.

In the timing diagram of FIG. 11, the SOC at or around time t53 is less than the modified target SOC that is the target SOC after modification. Hence, even when a change in the load current occurs at or around t53, the target SOC will not be modified. The target SOC may be modified after the SOC is increased above the modified target SOC by power regeneration.

In the present embodiment, supposing that the target SOC is modified to decrease, if the SOC is greater than the target SOC before modification or if the SOC is kept at the target SOC before modification, the modification condition will be met because the SOC is greater than the modified target SOC that is the target SOC after modification. Also, supposing that the target SOC is modified to decrease, if the SOC is increased by the alternator 40 charging the second rechargeable battery 22 and reaches the modified target SOC, the target SOC may be modified.

With the above configuration, the control apparatus of the present embodiment can provide the following advantage in addition to the advantages of the first embodiment.

(A4) When the SOC of the second rechargeable battery 22 is less than the modified target SOC, power generation by the alternator 40 is started in response to modification of the target SOC to increase the SOC to the modified target SOC.

When the SOC of the second rechargeable battery 22 is greater than the modified target SOC, power generation by the alternator 40 will not be started of the target SOC. In the present embodiment, the target SOC is permitted to be modified if the modification condition is met that the SOC is greater than the modified target SOC. Therefore, even when the target SOC is modified, power generation by the alternator 40 will not be started. This configuration can prevent deterioration of drivability that can occur when power generation by the alternator 40 is started.

Third Embodiment

A third embodiment is different from the first and second embodiments in the modification condition for permitting the target SOC to be modified. More specifically, when the operation of the internal-combustion engine is stopped, the target SOC is permitted to be modified. That is, when the load current increases during operation of the internal-combustion engine, the target SOC is retained. When idling of the internal-combustion engine is stopped, the target SOC may be modified. After the internal-combustion engine is restarted, power generation is performed so that the SOC is kept at the modified SOC.

Figure 7:
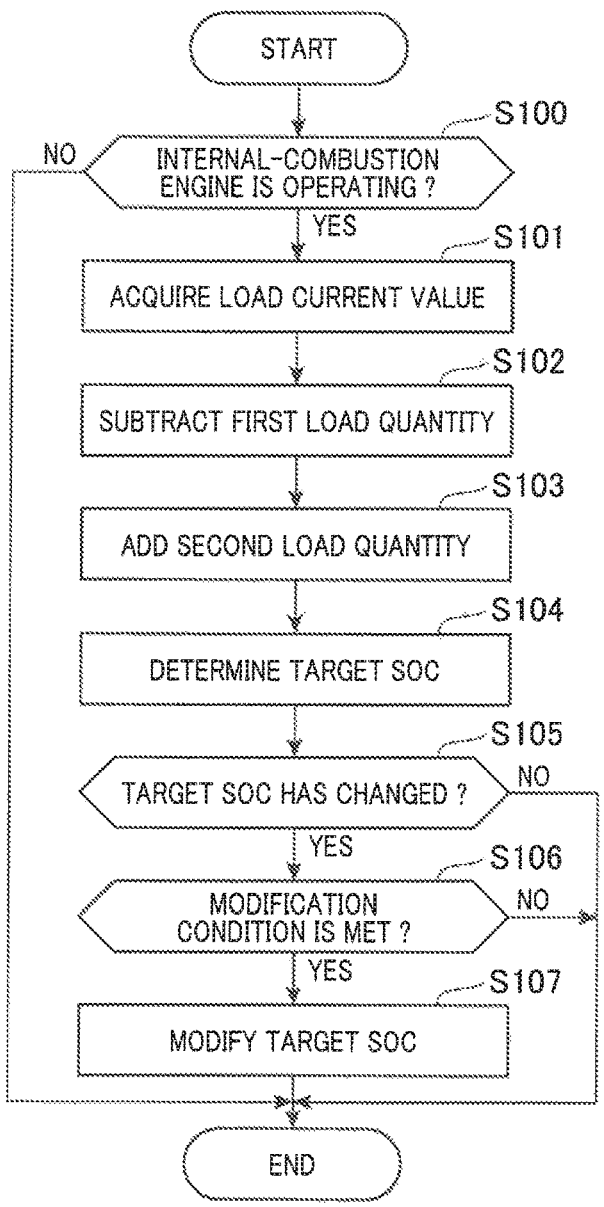
FIG. 7 is a flowchart of processing of the first embodiment.

The flowchart of processing of the present embodiment (not shown) is similar to that of the first endowment as shown in FIG. 7 except that even if "No" in step S100, a value of load current is acquired. After step S100, the process flow will proceed to step S104 without performing subtraction of the first load quantity and addition of the second load quantity.

Figure 12:
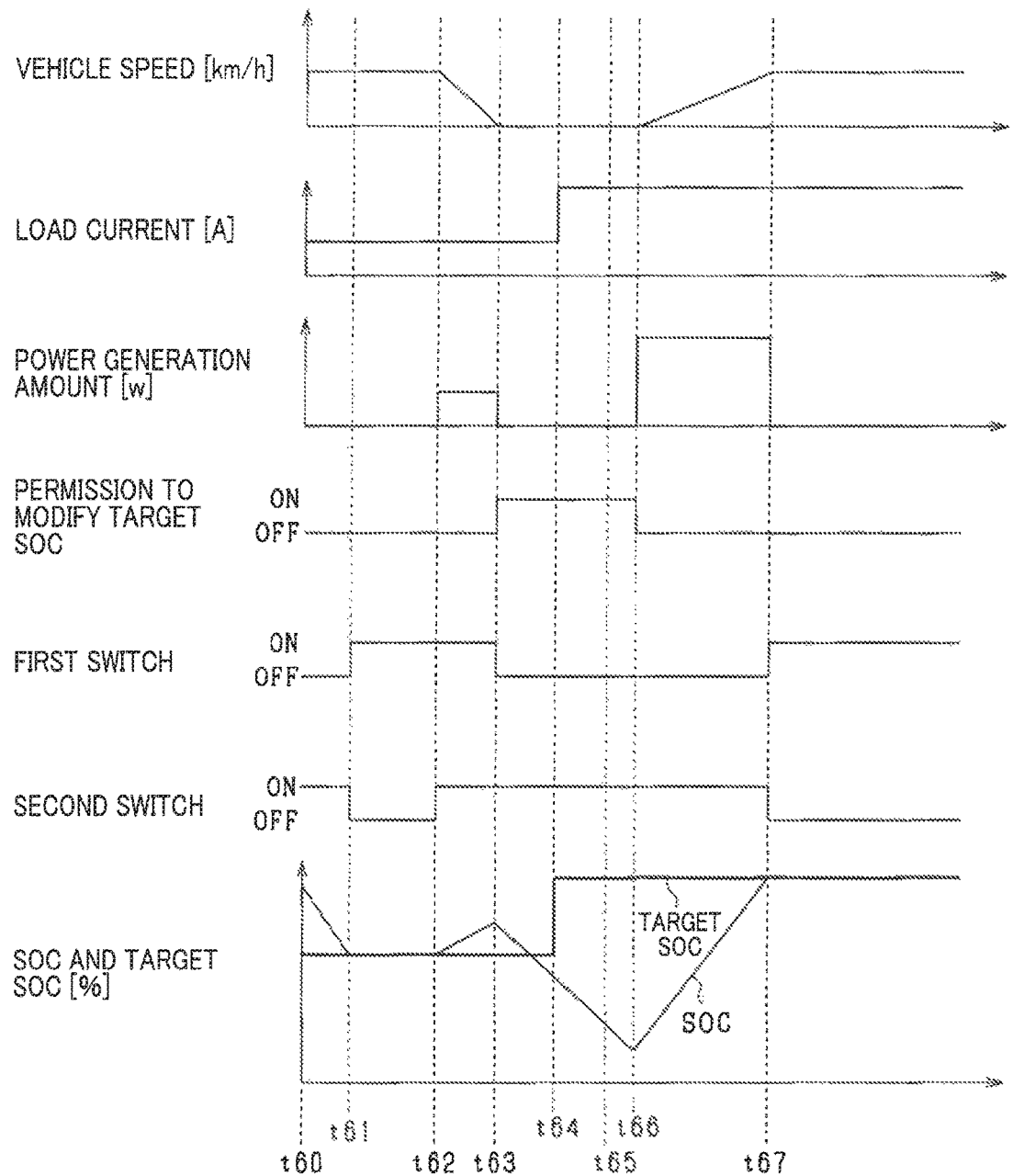
FIG. 12 is a timing diagram illustrating an example of processing in accordance with a third embodiment of the present invention.

The processing of the present embodiment will now be described with reference to FIG. 12. At time t60, the first switch 31 is turned off and the second switch 32 is turned on because the SOC is greater than the target SOC, whereby the first to third electrical loads 61-63 are supplied with power from the second rechargeable battery 22. Then, the SOC of the second rechargeable battery 22 decreases.

When the SOC reaches the target SOC at time t61, the first switch 31 is turned on and the second switch 32 is turned off to keep the SOC at the target SOC. Then, the first to third electrical loads 61-63 are supplied with power from the first rechargeable battery 21.

When the vehicle starts deceleration at time t62, power regeneration is performed by the alternator 40. At this time, the first switch 31 and the second switch 32 are both turned on to collect the regenerative power in the second rechargeable battery 22.

When the vehicle speed reaches substantially zero at time t63, the start-stop control is performed and the operation of the internal-combustion engine is thereby stopped. The first switch 31 is turned off and the second switch 32 is turned on to supply power from the second rechargeable battery 22 to the first to third electrical loads 61-63. As the operation of the internal-combustion engine is stopped, the target SOC is permitted to be modified. Then, the SOC of the second rechargeable battery 22 decreases due to power supply to the first to third electrical loads 61-63.

When the lead current increases at time t64, the target SOC is modified because modification of the target SOC is permitted. At time t64, power supply from the second rechargeable battery 22 to the first to third electrical loads 61-63 is continued. Therefore, the first switch 31 continues to be off and the second switch 32 continues to be on.

When the restart condition for restarting the internal-combustion engine is met at time t65, the starter motor 50 is activated. As the first switch 31 is off, the starter motor 50 is supplied with power from the first rechargeable battery 21 and the second rechargeable battery 22 continues to supply power to the first to third electrical loads 61-63.

When the internal-combustion engine is started at time t66, the first switch 31 and the second switch 32 are both turned on to charge the second rechargeable battery 22 with power generated by the alternator 40. The power consumption by the first to third electrical loads 61-63 is covered by electrical power generated by the alternator 40.

When the SOC reaches the target SOC at time t67, power generation by the alternator 40 is terminated. The first switch 31 is turned on and the second switch 32 is turned off to keep the SOC at the target SOC. Then, the first to third electrical loads 61-63 are supplied with power from the first rechargeable battery 21.

With the above configuration, the control apparatus of the present embodiment can provide the following advantage in addition to the advantages of the first embodiment.

(A5) When the operation of the internal-combustion engine is stopped, power generation by the alternator 40 is not performed even if the target SOC is modified. With this configuration, the operation of the alternator 40 is not caused by modification of the target SOC, which can prevent deterioration of drivability that can occur at the start of power generation by the alternator 40.

Fourth Embodiment

In each of the first to third embodiments, the target SOC is permitted to be modified if power generation by the alternator 40 is not performed in response to modification of the target SOC. In a fourth embodiment, the target SOC is permitted to be modified in a manner such that the start of power generation by the alternator 40 performed in response to modification of the target SOC is less noticeable by a driver of the vehicle. More specifically, the target SOC is permitted to be modified if a vehicle speed is greater than a predetermined threshold.

Figure 13:
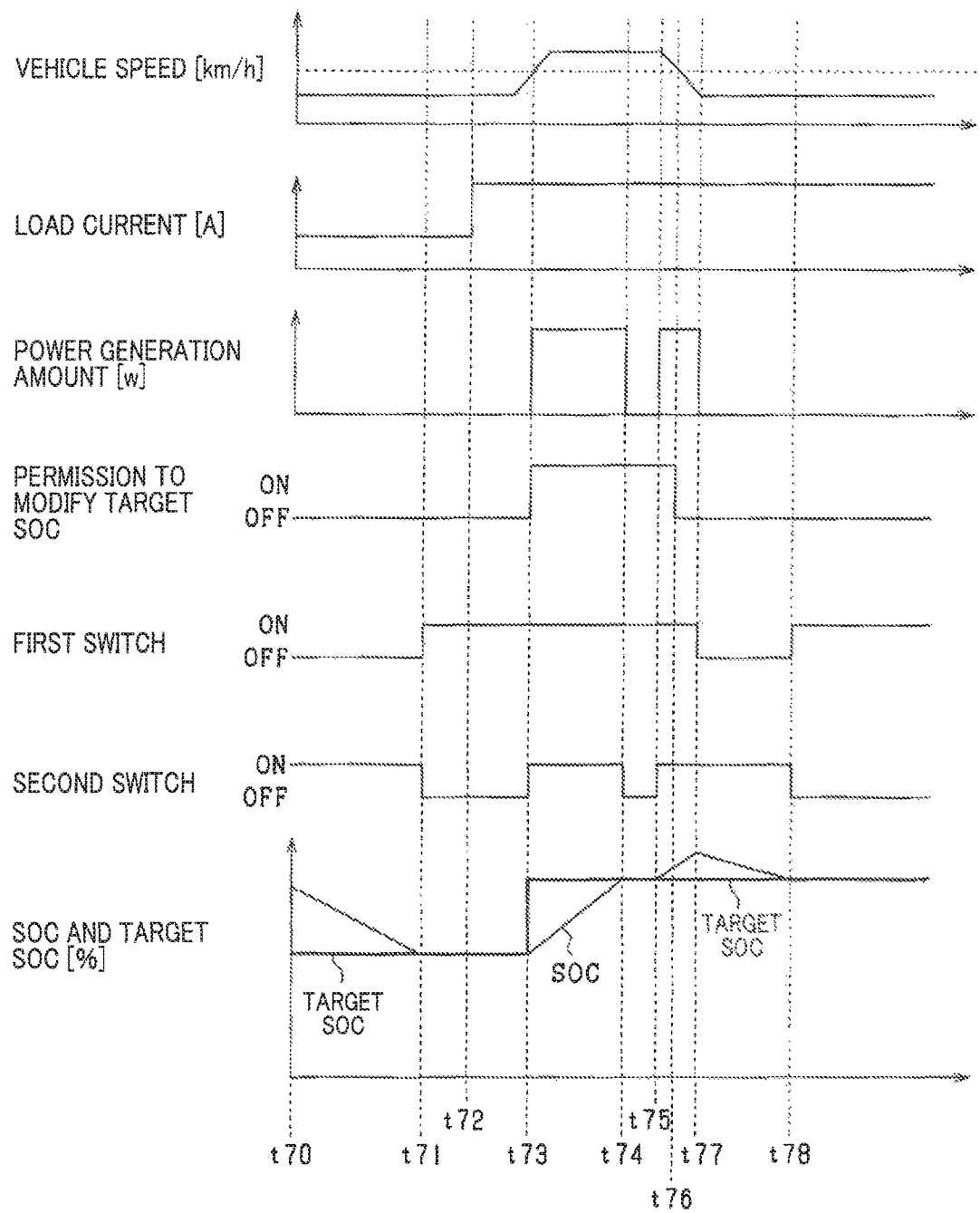
FIG. 13 is a timing diagram illustrating an example of processing in accordance with a fourth embodiment of the present invention.

Processing of the present embodiment will now be described with reference to FIG. 13. A flowchart of the processing of the present embodiment (not shown) is similar to the flowchart of FIG. 7. Therefore, it will not be described again.

At time t70, the first switch 31 is turned off and the second switch 32 is turned on because the SOC is greater than the target SOC, whereby the first to third electrical loads 61-63 are supplied with power from the second rechargeable battery 22. Then, the SOC of the second rechargeable battery 22 decreases.

When the SOC reaches the target SOC at time t71, the first switch 31 is turned on and the second switch 32 is turned off to keep the SOC at the target SOC. Then, the first to third electrical loads 61-63 are supplied with power from the first rechargeable battery 21.

At time t72, though the load current increases, the target SOC is not modified because the vehicle speed is less than the threshold. That is, the first switch 31 continues to be on and the second switch 32 continues to be off to keep the SOC at the target SOC.

Thereafter, the vehicle initiates acceleration. When the vehicle speed exceeds the threshold at time t73, the target SOC is permitted to be modified. As the load current has already increased, the target SOC is modified to a value based on the increased load current. As the SOC is less than the modified target SOC, the first switch 31 and the second switch 32 are both turned on and power generation by the alternator 40 is performed to charge the second rechargeable battery 22.

When the SOC reaches the target SOC at time t74, power generation by the alternator 40 is terminated, and the first switch 31 is turned on and the second switch 32 is turned off to keep the SOC at the target SOC. Then, the first to third electrical loads 61-63 are supplied with power from the first rechargeable battery 21.

When the vehicle starts deceleration at time t75, power regeneration is performed. At this time, the first switch 31 and the second switch 32 are both turned on to collect the regenerative power in the second rechargeable battery 22.

Thereafter, the deceleration of the vehicle is continued. When the vehicle speed is less than the threshold at time t76, the target SOC is not permitted to be modified. As the deceleration of the vehicle is continued, the power regeneration is continued.

When the vehicle terminates deceleration at time t77, power regeneration is terminated, and the first switch 31 is turned off and the second switch 32 is turned on, whereby the first to third electrical loads 61-63 are supplied with power from the second rechargeable battery 22. Then, the SOC of the second rechargeable battery 22 decreases.

When the SOC reaches the target SOC at time t78, power generation by the alternator 40 is terminated. The first switch 31 is turned on and the second switch 32 is turned off to keep the SOC at the target SOC. Then, the first to third electrical loads 61-63 are supplied with power from the first rechargeable battery 21.

With the above configuration, the control apparatus of the present embodiment can provide the following advantage in addition to the advantages of the first embodiment.

(A6) As the vehicle speed increases, that is, as the running load increases, a ratio of the power generation load to the internal-combustion engine load decreases even when power generation by the alternator 40 is started. That is, as the vehicle speed increases, the start of power generation by the alternator 40 is less noticeable by the vehicle driver. In the present embodiment, the target SOC is permitted to be modified when the vehicle speed is greater than the threshold and thus the start of power generation by the alternator 40 is less noticeable by the vehicle driver. This configuration can prevent deterioration of drivability that can occur when power generation by the alternator 40 is started.

Fifth Embodiment

In each of the first to third embodiments, the target SOC is permitted to be modified if power generation by the alternator 40 is not performed in response to modification of the target SOC. In the fourth embodiment, the target SOC is permitted to be modified in a manner such that the start of power generation by the alternator 40 performed in response to modification of the target SOC is less noticeable by a driver of the vehicle.

Unlike the first to fourth embodiments, the target SOC is permitted to be modified regardless of an operating state of the alternator 40. In addition, when the modification condition for permitting the target SOC to be modified is not met, an amount of power generation by the alternator 40 is decreased as compared to when the modification condition is met, whereby a ratio of the power generation load to the internal-combustion engine load is decreased such that the start of power generation by the alternator 40 is less noticeable by the vehicle driver.

The processing of the present embodiment will now be described with reference to FIG. 14. In a timing diagram of FIG. 14, an amount of power generation is limited when the modification condition of the first embodiment is not met.

At time t80, the first switch 31 is turned off and the second switch 32 is turned on because the SOC is greater than the target SOC, whereby the first to third electrical loads 61-63 are supplied with power from the second rechargeable battery 22. Then, the SOC of the second rechargeable battery 22 decreases.

When the SOC reaches the target SOC at time t81, the first switch 31 is turned on and the second switch 32 is turned off to keep the SOC at the target SOC. Then, the first to third electrical loads 61-63 are supplied with power from the first rechargeable battery 21.

When the vehicle starts deceleration at time t82, power regeneration is performed by the alternator 40. The first switch 31 and the second switch 32 are both turned on to collect the regenerative power in the second rechargeable battery 22. As the alternator 40 is operating, the generation amount limitation is removed.

When the vehicle speed reaches substantially zero at time t83, the start-stop control is performed and the operation of the internal-combustion engine is thereby stopped. The first switch 31 is turned off and the second switch 32 is turned on to supply power from the second rechargeable battery 22 to the first to third electrical loads 61-63. Thus, the SOC of the second rechargeable battery 22 decreases due to power supply to the first to third electrical loads 61-63.

When a restart condition for restarting the internal-combustion engine is met at time t84, the starter motor 50 is activated. As the first switch 31 is off, the starter motor 50 is supplied with power from the first rechargeable battery 21 and the second rechargeable battery 22 continues to supply power to the first to third electrical loads 61-63.

When the internal-combustion engine is started at time t85, the first switch 31 and the second switch 32 are both turned on to charge the second rechargeable battery 22 with power generated by the alternator 40. The power consumption by the first to third electrical loads 61-63 is covered by electrical power generated by the alternator 40. The power generation amount limitation is removed.

When the SOC reaches the target SOC at time t86, power generation by the alternator 40 is stopped. Then, the first switch 31 is turned on and the second switch 32 is turned off to keep the SOC at the target SOC.

When the load current increases at time t87, the target SOC is required to be increased accordingly. Thus, the target SOC is modified. As the power generation amount is limited at this time, the alternator 40 is operated so that the power generation amount is gradually increased.

When the SOC reaches the target SOC at time t88, power generation by the alternator 40 is terminated. The first switch 31 is turned on and the second switch 32 is turned off to keep the SOC at the target SOC. Then, the first to third electrical loads 61-63 are supplied with power from the first rechargeable battery 21.

Figure 14:
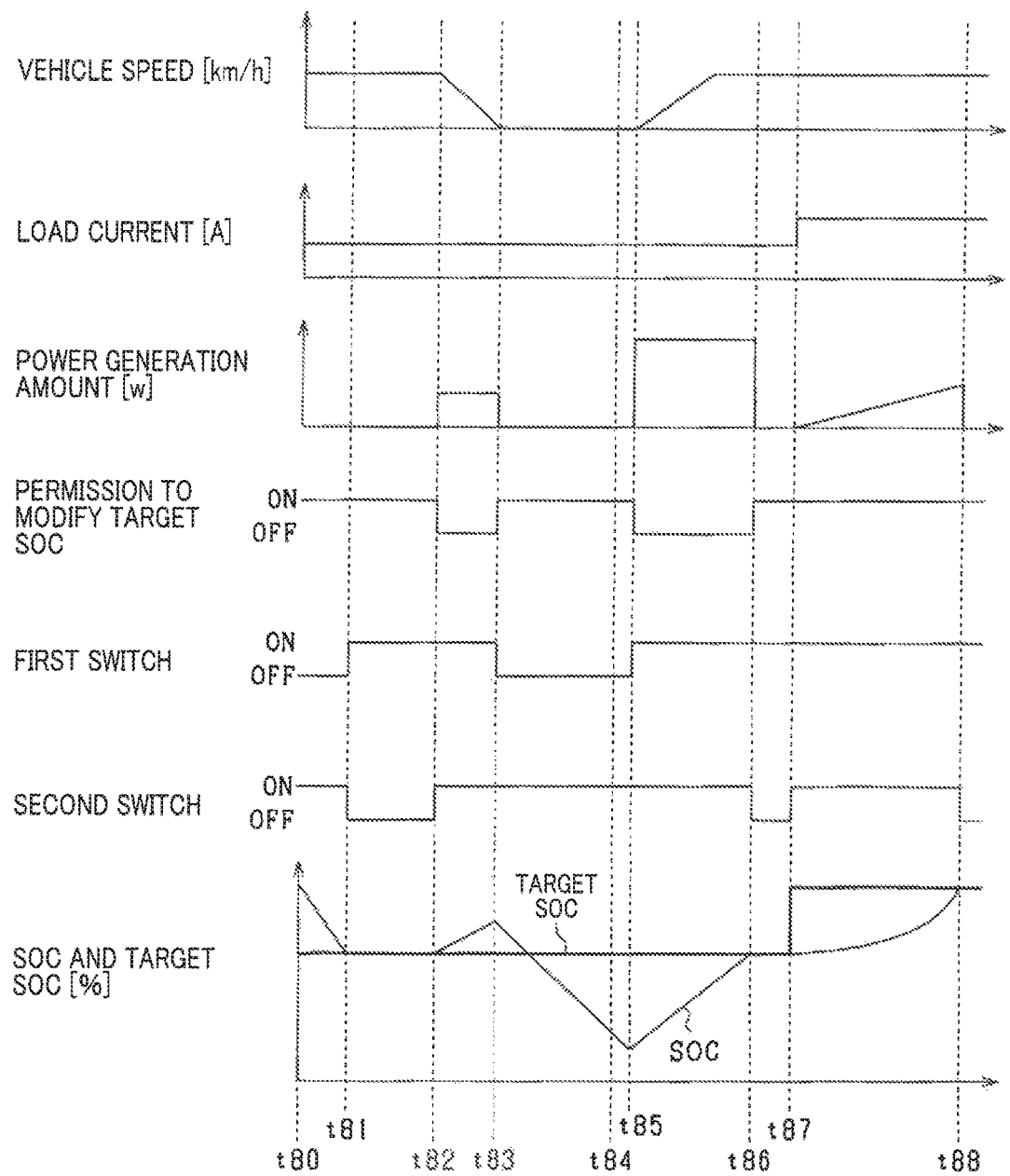
FIG. 14 is a timing diagram illustrating an example of processing in accordance with a fifth embodiment of the present invention.

In the example of FIG. 14, when the power generation amount is limited, the power generation amount is gradually increased. Alternatively, when the power generation amount is limited, the power generation amount may be kept at a smaller value as compared to when the power generation amount is not limited.

With the above configuration, the control apparatus of the present embodiment can provide the following advantage in addition to the advantages of the first embodiment.

(A7) As long as the amount of power generation by the alternator 40 is limited, even if the operation of the alternator 40 is started, a load of the alternator 40 on the internal-combustion engine is reduced as compared to when the amount of power generation by the alternator 40 is not limited. Therefore, changes in the load on the internal-combustion engine are less noticeable by the vehicle driver. This configuration can prevent deterioration of drivability.

Sixth Embodiment

In the present embodiment, subtraction and addition calculation operations to be performed on the load current value detected by the current detector 71 to calculate the target SOC are modified.

As described in the first embodiment, the first electrical loads 61 are configured to operate when the internal-combustion engine is operating and not to operate when the internal-combustion engine is stopped. The second electrical loads 62 are configured to operate when the internal-combustion engine is stopped and not to operate when the internal-combustion engine is operating. To modify the target SOC when the internal-combustion engine is operating, the first load quantity of the first electrical loads 61 is subtracted from the detected load current value, and the second load quantity of the second electrical loads 62 is added to the detected load current value minus the first load quantity. However, at some timings to calculate the target SOC, the first electrical loads 61 may not operate when the internal-combustion engine is operating and the second electrical loads 62 may operate when the internal-combustion engine is operating.

Figure 15:
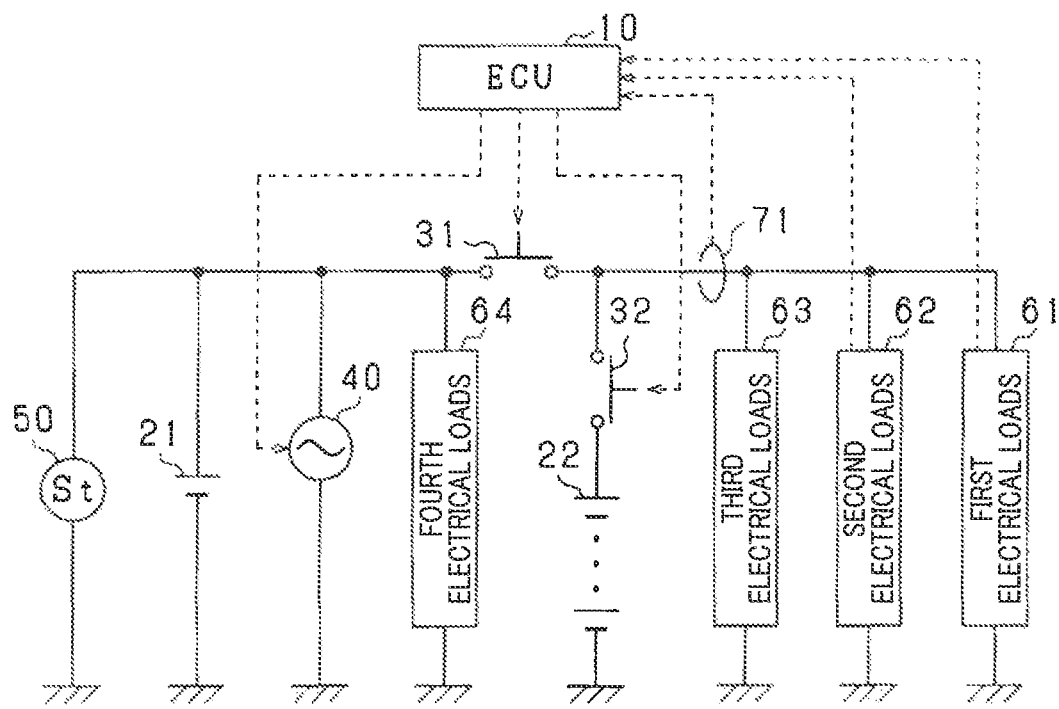
FIG. 15 is a block diagram of a power supply system including a control apparatus in accordance with a sixth embodiment.

In the present embodiment, as shown in FIG. 15, the ECU 10 acquires an operating state of the first electrical loads 61 and an operating state of the second electrical loads 62, and using these operating states, performs subtraction and addition calculation operations on the load current value. More specifically, when the first electrical loads 61 are operating, the first load quantity is subtracted from the load current value, and when the first electrical loads 61 are not operating, the first load quantity is not subtracted from the load current value. In addition, when the second electrical loads 62 are not operating, the second load quantity is added to the load current value, and when the second electrical loads 62 are operating, the second load quantity is not added to the load current value.

Figure 16:
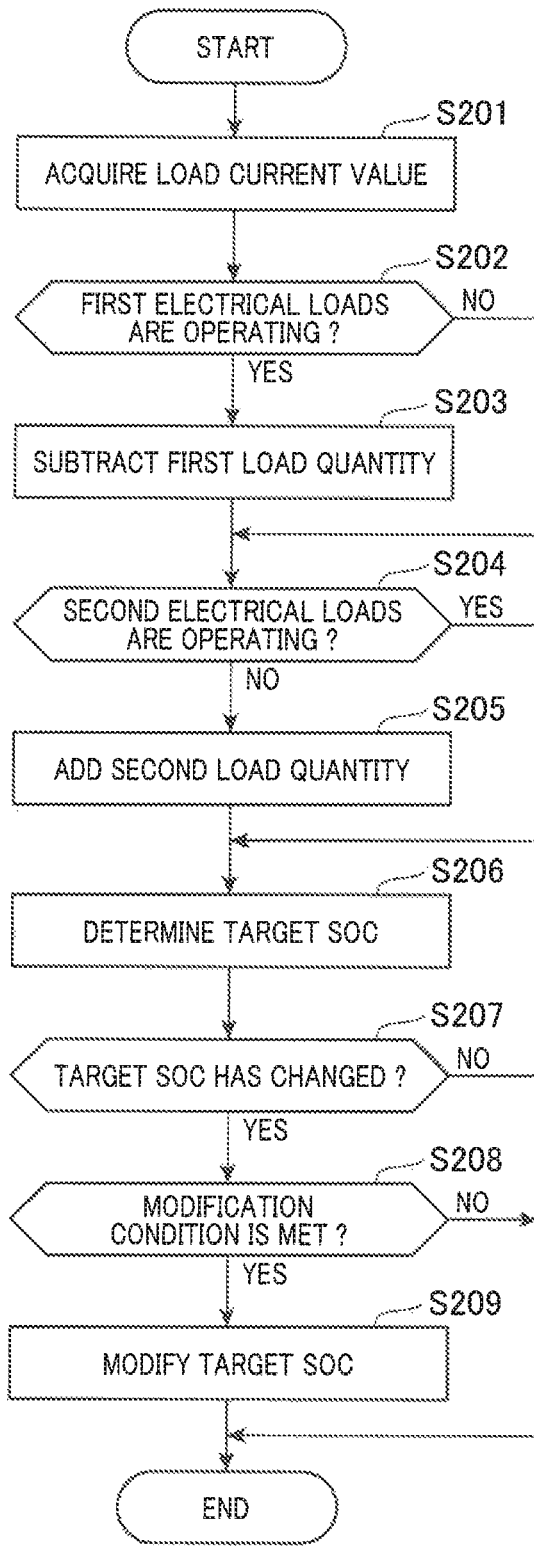
FIG. 16 is a flowchart of processing of the sixth embodiment.

Processing of the present embodiment will now be described with reference to a flowchart of FIG. 16. First, in step S201, the ECU 10 acquires a value of the load current from the current detector 71. Subsequently, in step S202, the ECU 10 determines whether or not the first electrical loads 61 are operating. If in step S202 it is determined that the first electrical loads 61 are operating, the process flow proceeds to step S203, where the ECU 10 subtracts the first load quantity from the load current value.

If in step S202 it is determined that the first electrical loads 61 are not operating, the process flow proceeds to step S204. In step S204, the ECU 10 determines whether or not the second electrical loads 62 are operating. If in step S204 it is determined that the second electrical loads 62 are not operating, the process flow proceeds to step S205, where the ECU 10 adds the second load quantity.

If in step S204 it is determined that the second electrical loads 62 are operating, or after step S205, the process flow proceeds to step S206. In step S206, the ECU 10 determines a target SOC using the resultant load current value.

After the target SOC is determined in step S206, the process flow proceeds to step S207. In step S207, the ECU 10 determines whether or not the target SOC has changed from the previous target SOC that is a target SOC used in the previous cycle. If in step S207 it is determined the target SOC has changed from the previous target SOC, then in step S208, the ECU 10 determines whether or not a condition for modifying the target SOC (referred to as a modification condition) is met. In step S208, the ECU 10 determines whether or not any one of the modification conditions of the first to fourth embodiments is met. If in step S208 the modification condition is met, the process flow proceeds to step S209. In step S209, the ECU 10 modifies the target SOC. Therefore, the process flow ends.

If in step S207 it is determined that the target SOC has not changed from the previous target SOC or if in step S208 the modification condition is not met, then the ECU 10 does not modify the target SOC. Thereafter, the process flow ends.

As described in the first embodiment, the first electrical loads 61 may include a plurality of electrical loads. The second electrical loads 62 may also include a plurality of electrical loads. The first load quantity may be a sum of load quantities to be subtracted for the respective first electrical loads. The second load quantity may be a sum of load quantities to be added for the respective second electrical loads. The ECU 10 acquires operational states of the respective first electrical loads, and subtracts the load quantities for the respective first electrical loads depending on the operational states of the respective first electrical loads. The ECU 10 also acquires operational states of the respective second electrical loads, and adds the load quantities for the respective second electrical loads depending on the operational states of the respective second electrical loads.

Figure 17:
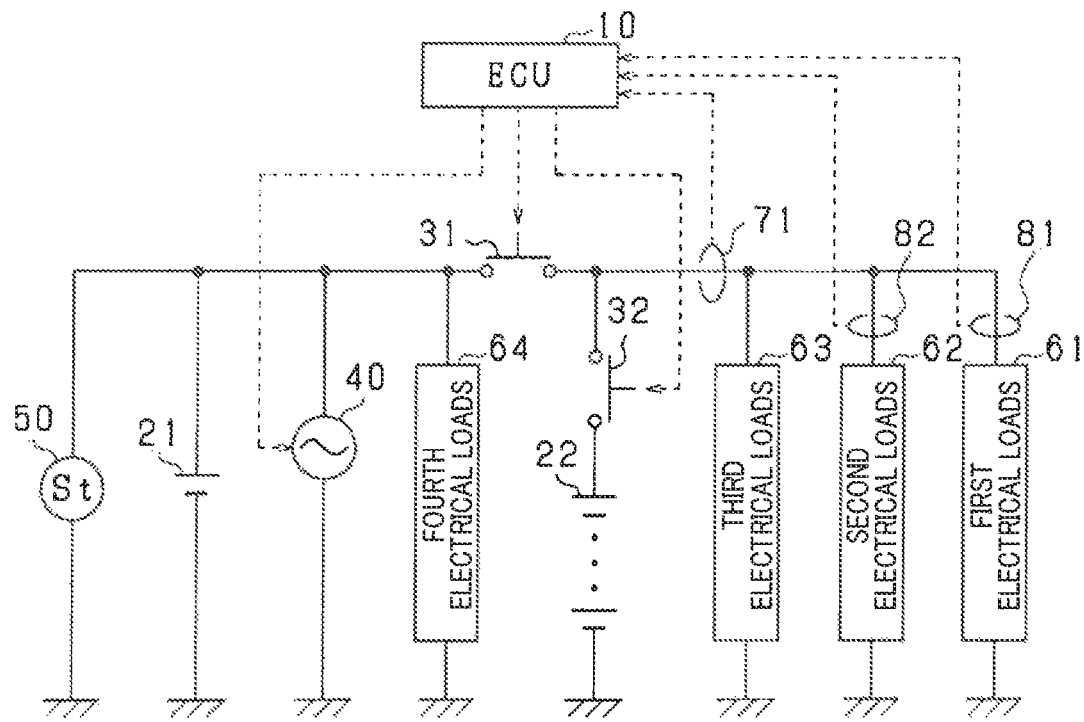
FIG. 17 is a block diagram of another example of the power supply system including the control apparatus of the sixth embodiment.

As shown in FIG. 17, the system may include a first detector 81 that detects a current flow through the first electrical load 61 and a second detector 82 that detects a current flow through the first electrical loads 62. In such an embodiment, the first load quantity to be subtracted may be a value of the current detected by the first detector 81. The second load quantity to be added may be changed depending on a value of the current detected by the second detector 82. That is, the second load quantity may be calculated by subtracting a value of the current detected by the second detector 82 from a reference value based on the consumption current of each second electrical load 62 in a predetermined operating state. The second load quantity calculated in this way decreases with increasing value of the current detected by the second detector 82. The target SOC set in this way can be more appropriate for the load current value when idling of the internal-combustion engine is stopped.

With the above configuration, the control apparatus of the present embodiment can provide the following advantage in addition to the advantages of the first embodiment.

(A8) To subtract the first load quantity from the detected load current value and add the second load quantity, operating states of the first electrical loads 61 and the second electrical loads 62 are acquired, and based on the acquired operating states, the target SOC is calculated. With this configuration, the target SOC can be more appropriate for the load current value when the internal-combustion engine is stopped. Therefore, the target SOC can be set more accurately, and opportunities for regeneration can be increased while preventing the SOC when idling of the internal-combustion engine is stopped from decreasing below the lower limit.

Modifications (M1) In the first embodiment, also in the case that the target SOC is to be decreased, it is determined whether or not the target SOC is permitted to be modified. Alternatively, in the case that the target SOC is to be increased, it may be determined whether or not the target SOC is permitted to be modified, but in the case where the target SOC is to be decreased, the target SOC may be decreased whether the modification condition is met. In the case that the target SOC before modification is greater than the SOC and power generation by the alternator 40 is already being performed, or in the case that the internal-combustion engine is stopped and power generation by the alternator 40 is not performed, the SOC may be decreased below the target SOC that is modified to be decreased. That is, in the case that the target SOC is decreased, power generation by the alternator 40 will not be initiated, which may not affect the drivability. Permitting the target SOC to be decreased even if the modification condition is not met may increase the opportunity for decreasing the target SOC. Given more opportunities for decreasing the target SOC, the SOC is more likely to be decreased, which can increase the opportunity for power regeneration.

(M2) A plurality of modification conditions, among the modification conditions employed in the above embodiments, may be employed, where if at least one of the plurality of modification conditions is met, the target SOC is permitted to be modified. With this configuration, the modification condition is more likely to be met, which can increase the opportunity for modifying the target SOC.

(M3) In a situation where idling of the internal-combustion engine is not performed, such as a situation where stopping idling of the internal-combustion engine is prohibited by the driver's operation, as long as the vehicle is not moving, even if a load on the internal-combustion engine is increased, a braking force caused by the load is less noticeable by the vehicle driver. Therefore, a condition that the vehicle is not moving may be employed as a modification condition for modifying the target SOC.

(M4) When the running load is high so that the start of power generation by the alternator 40 is less noticeable by the vehicle driver as in the fourth embodiment, another modification condition may be employed to modify the target SOC. More specifically, when the acceleration is greater than a predetermined value, the target SOC may be permitted to be modified.

(M5) To modify the target SOC when the start of the operation of the alternator 40 is less noticeable by the vehicle driver as in the fourth embodiment, a modification condition other than the running load may be employed. More specifically, as a ratio of the load of the alternator to the output of the rotary shaft of the internal-combustion engine decreases with increasing output of the rotary shaft, rotational speed reduction by the alternator 40 can be prevented. Therefore, when a state quantity indicative of the internal-combustion engine power is greater than a predetermined value, the target SOC may be permitted to be modified. The state quantity indicative of the internal-combustion engine power may include an amount of accelerator pedal depression by the driver, a throttle opening, a torque of the rotary shaft of the internal-combustion engine, or a rotational speed of the rotary shaft of the internal-combustion engine.

(M6) When the operation of the alternator 40 is started, a load of the alternator 40 is applied to the internal combustion engine, thereby generating a braking force. To modify the target SOC when the start of the operation of the alternator 40 is less noticeable by the vehicle driver as in the fourth embodiment, a modification condition may be employed that the braking force is being applied to the vehicle. That is, when a brake pedal is depressed by the driver, a braking force caused by the alternator 40 is less noticeable by the vehicle driver even if a load of the alternator 40 is applied to the internal-combustion engine. Therefore, when a state quantity indicative of the braking force of the vehicle is greater than a predetermined value, the target SOC may be permitted to be modified. The state quantity indicative of the braking force of the vehicle may include an amount of brake pedal depression by the driver, pressure of a master cylinder, or an acceleration of the vehicle.

Figure 18:
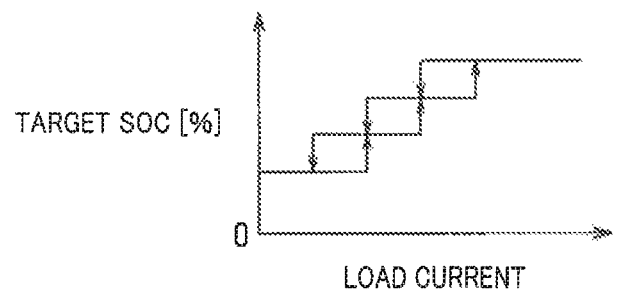
FIG. 18 is a graph of target SOC versus load current value.

(M7) As shown in FIG. 18, hysteresis may be built to determine the target SOC depending on the load current. With this configuration, hunting may be suppressed that can occur when controlling the alternator 40, the first switch 31 and the second switch 32.

(M8) An internal resistance value of the second rechargeable battery 22 may vary depending on a temperature, aging degradation or the like. A voltage drop during discharge of the second rechargeable battery 22 increases with increasing internal resistance value. Therefore, in each of the first to fifth embodiments, instead of modifying the target SOC depending on the load current, the target SOC may be increased with increasing internal resistance value. In addition, discharging of the second rechargeable battery 22 proceeds as the internal resistance value increases. Therefore, like the load current, the internal resistance value may be a state quantity correlated with the discharging state of the second rechargeable battery 22.

(M9) A power generation amount can be increased with increasing vehicle speed. Therefore, the target SOC of the second rechargeable battery 22 may be set lower as the vehicle speed increases, whereby the charge level of the second rechargeable battery 22 during regeneration can be raised. As charging of the second rechargeable battery 22 may be increased with increasing vehicle speed, the internal resistance value may be a state quantity correlated with the SOC of the second rechargeable battery 22.

(M10) The vehicle driver operating the electrical loads may cause the target SOC to be modified. In such a case, as the vehicle driver can notice the start of the operation of the alternator 40 caused by his or her own operation, deterioration of drivability may be less noticeable by the vehicle driver. Therefore, in each of the above embodiments, when the vehicle driver operates any one of the electrical loads 61 to 64, the target SOC may be permitted to be modified. That is, when the vehicle driver operates any one of the electrical loads 61 to 64, the load current will increase. When the vehicle driver operates any one of the electrical loads 61 to 64 in a situation where the target SOC calculated based on the Increased load current is greater than the current SOC, the target SOC may be modified. Also when the vehicle driver operates any one of the electrical loads 61 to 64 and the load current has increased due to the driver's operation, the target SOC is permitted to be modified. Thus, the target SOC may be modified based on the increased load current.

(M11) In the first or sixth embodiment, subtraction and addition of the first load quantity are both performed. Alternatively, either subtraction or addition of the first load quantity may be performed.

(M12) In the first embodiment, the first electrical loads 61 operate when the internal-combustion engine is operating and do not operate when the internal-combustion engine is not operating. Alternatively, as in the sixth embodiment, the first electrical loads 61 may not operate depending on situations when the internal-combustion engine is operating and may operate depending on situations when the internal-combustion engine is not operating. Similarly, the second electrical loads 62 may operate depending on situations when the internal-combustion engine is operating and may not operate depending on situations when the internal-combustion engine is not operating.

(M13) In each of the above embodiments, the alternator 40 is on the first rechargeable battery 21 side of the first switch 31. Alternatively, the alternator 40 may be on the second rechargeable battery 22 side of the first switch 31.

(M14) In each of the above embodiments, the starter motor 50 is on the first rechargeable battery 21 side of the first switch 31. Alternatively, the starter motor 50 may be on the second rechargeable battery 22 side of the first switch 31.

(M15) In each of the above embodiments, the control is performed based on the SOC of the second rechargeable battery 22. The charge level of the second rechargeable battery 22 is may be an amount of power (kWh) or an amount of charge (Ah). The control may be performed based on the target charge level.

(M16) In each of the above embodiments, a traction motor is not installed in the vehicle. Alternatively, the traction motor may be provided on the second rechargeable battery 22 side of the first switch 31, where the traction motor is supplied with power from the second rechargeable battery 22 via a boost circuit. Still alternatively, the traction motor may be provided on the first rechargeable battery 21 side of the first switch 31.

What is claimed is:

1. A control apparatus mounted in a vehicle and configured to control a power supply system comprising:
    an alternator connected to an output shaft of an internal-combustion engine of the vehicle and configured to perform power generation by rotation of the output shaft of the internal-combustion engine;
    a first rechargeable battery that can be charged with electrical power generated by the alternator; and
    a second rechargeable battery electrically connected in parallel with the first rechargeable battery, the second rechargeable battery having a higher output density or a higher energy density than that of the first rechargeable battery,
    wherein the control apparatus comprises:
        a power generation controller configured to operate the alternator such that a charge level of the second rechargeable battery becomes a target charge level;
        a target charge level setter configured to variably set the target charge level of the second rechargeable battery based on changes in a state quantity correlated with at least one of a charge state and a discharge state of the second rechargeable battery; and
        a limiter configured to, if there is a change in the state quantity and if a prescribed permission condition is not met, limit an operation of the alternator.

2. The control apparatus according to claim 1, wherein the limiter is configured to, if the prescribed permission condition is not met, disallow the target charge level setter from modifying the target charge level of the second rechargeable battery.

3. The control apparatus according to claim 2, wherein the limiter is configured to, when the target charge level setter modifies the target charge level of the second rechargeable battery to be decreased, permit the target charge level setter to modify the target charge level of the second rechargeable battery, regardless of a modification condition.

4. The control apparatus according to claim 1, wherein the limiter is configured to, if the prescribed permission condition is not met and if the charge level of the second rechargeable battery is lower than the target charge level, limit the operation of the alternator by suppressing an amount of power generation by the alternator.

5. The control apparatus according to claim 1, wherein the prescribed permission condition comprises a condition that the second rechargeable battery is being charged by the operation of the alternator under control of the power generation controller.

6. The control apparatus according to claim 1, wherein the prescribed permission condition comprises a condition that the charge level of the second rechargeable battery is higher than a modified target charge level.

7. The control apparatus according to claim 1, wherein the prescribed permission condition comprises a condition indicating that the internal-combustion engine is not operating.

8. The control apparatus according to claim 1, wherein the prescribed permission condition comprises a condition that a running load of the vehicle is greater than a predetermined value.

9. The control apparatus according to claim 1, wherein the prescribed permission condition comprises a condition that an output of the internal-combustion engine is greater than a predetermined value.

10. The control apparatus according to claim 1, wherein the prescribed permission condition comprises a condition that a braking force is generated in the vehicle.

11. The control apparatus according to claim 1, wherein the prescribed permission condition comprises a condition indicating that the vehicle is not moving.

12. The control apparatus according to claim 1, wherein an electrical load is electrically connected to at least one of the first rechargeable battery and the second rechargeable battery, and the prescribed permission condition comprises a condition indicating the electrical load being operated by a driver of the vehicle.

* * * * *